US010818352B2

(12) United States Patent
Lee et al.

(10) Patent No.: US 10,818,352 B2
(45) Date of Patent: Oct. 27, 2020

(54) RESISTIVE MEMORY DEVICES HAVING ADDRESS-DEPENDENT PARASITIC RESISTANCE COMPENSATION DURING PROGRAMMING

(71) Applicant: Samsung Electronics Co., Ltd., Suwon-si, Gyeonggi-do (KR)

(72) Inventors: Jun-gyu Lee, Hwaseong-si (KR); Yong-jun Lee, Hwaseong-si (KR); Bilal Ahmad Janjua, Suwon-si (KR); Chea-ouk Lim, Hwaseong-si (KR); Makoto Hirano, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/413,709

(22) Filed: May 16, 2019

(65) Prior Publication Data
US 2020/0098427 A1  Mar. 26, 2020

(30) Foreign Application Priority Data

Sep. 21, 2018 (KR) .................. 10-2018-0114375

(51) Int. Cl.
*G11C 13/00* (2006.01)
*H01L 27/24* (2006.01)
*H01L 45/00* (2006.01)

(52) U.S. Cl.
CPC ...... *G11C 13/0069* (2013.01); *G11C 13/0004* (2013.01); *G11C 13/0028* (2013.01); *G11C 13/0038* (2013.01); *H01L 27/2427* (2013.01); *H01L 45/06* (2013.01); *G11C 2013/0078* (2013.01); *G11C 2213/71* (2013.01); *G11C 2213/72* (2013.01); *H01L 27/2481* (2013.01);
(Continued)

(58) Field of Classification Search
CPC ............ G11C 13/0069; G11C 13/0028; G11C 13/0038; G11C 13/0004; G11C 13/0002; G11C 11/1675; G11C 2013/0078; G11C 2213/72; G11C 2213/07; H01L 27/2427; H01L 45/06; H01L 45/144; H01L 27/2481; H01L 45/1233
See application file for complete search history.

(56) References Cited

U.S. PATENT DOCUMENTS 8,184,470 B2   5/2012  Toda et al.
8,259,490 B2   9/2012  Kang et al.
(Continued)

*Primary Examiner* — Ajay Ojha
(74) *Attorney, Agent, or Firm* — Myers Bigel, P.A.

(57) ABSTRACT

An integrated circuit memory device includes an array of resistive memory cells and a programming circuit, which is electrically coupled by a plurality of word lines and plurality of bit lines to corresponding rows and columns of the resistive memory cells. The programming circuit includes a control circuit and word line driver that are collectively configured to generate word line program voltages having magnitudes that vary as a function of the row and/or column addresses of the resistive memory cells in the array, during operations to program the array with write data. According to the function, the magnitude of a word line program voltage associated with a first resistive memory cell having a first parasitic resistance is less than a magnitude of a word line program voltage associated with a second resistive memory cell having a second parasitic resistance, which is greater than the first parasitic resistance.

15 Claims, 21 Drawing Sheets

(52) U.S. Cl.
CPC ........ *H01L 45/1233* (2013.01); *H01L 45/144* (2013.01)

(56) References Cited

U.S. PATENT DOCUMENTS

| | | | |
|---|---|---|---|
| 8,837,197 | B2 | 9/2014 | Oh et al. |
| 8,897,064 | B2 | 11/2014 | Chen et al. |
| 8,902,635 | B2 | 12/2014 | Kawahara et al. |
| 9,378,819 | B2 | 6/2016 | Park |
| 9,887,003 | B2 | 2/2018 | Katou et al. |
| 10,090,049 | B2 * | 10/2018 | Ho .................... G11C 16/3427 |
| 2010/0321977 | A1 * | 12/2010 | Sekar ................ G11C 13/0069 365/148 |
| 2014/0233327 | A1 * | 8/2014 | Chen ........................ G11C 7/00 365/189.09 |

* cited by examiner

FIG. 2

MTa

| Y \ X | 1 | 2 | ... | i-1 | i |
|---|---|---|---|---|---|
| 1 | A1 (Rpara1) | A2 (Rpara2) | ⋮ | ⋮ | ⋮ |
| 2 | A2 (Rpara2) | A3 (Rpara3) | ⋮ | ⋮ | ⋮ |
| ⋮ | ⋮ | ⋮ | ⋮ | ⋮ | ⋮ |
| j-1 | ⋮ | ⋮ | ⋮ | An-2 (Rpara_n-2) | An-1 (Rpara_n-1) |
| j | ⋮ | ⋮ | ⋮ | An-1 (Rpara_n-1) | An (Rpara_n) |

RESISTIVE MEMORY DEVICES HAVING ADDRESS-DEPENDENT PARASITIC RESISTANCE COMPENSATION DURING PROGRAMMING

REFERENCE TO PRIORITY APPLICATION

This application claims the benefit of Korean Patent Application No. 10-2018-0114375, filed Sep. 21, 2018, in the Korean Intellectual Property Office, the disclosure of which is hereby incorporated herein by reference in its entirety.

BACKGROUND

The inventive concept relates to memory devices and, more particularly, to resistive memory devices and methods of operating same.

Research into next generation memory devices has been conducted in response to the demand for higher capacity and lower power consumption of memory devices. Such next generation memory devices are required to have high integration of dynamic random access memory (DRAM), non-volatility of flash memory, and high speed performance of static RAM (SRAM). Phase change RAM (PRAM), nano floating gate memory (NFGM), polymer RAM (PoRAM), magnetic RAM (MRAM), ferroelectric RAM (FeRAM), resistive RAM (RRAM), and the like are being discussed as next generation memory devices that meet the above-described requirements.

SUMMARY

The inventive concept provides a resistive memory device that compensates for a change in a parasitic resistance value according to a position of a selected memory cell in a memory cell array, thereby improving the program performance and endurance of the resistive memory device.

According to some embodiments of the invention, an integrated circuit memory device is provided, which includes an array of resistive memory cells, and a programming circuit, which is electrically coupled by a plurality of word lines and a plurality bit lines to corresponding rows and columns of resistive memory cells in the array. This programming circuit can include a control circuit and a word line driver that are collectively configured to generate word line program voltages having magnitudes that vary as a function of the row and/or column addresses of the resistive memory cells in the array, during operations to program the array with write data.

According to the function, a magnitude of a word line program voltage associated with a first resistive memory cell having a first parasitic resistance associated therewith, is less than a magnitude of a word line program voltage associated with a second resistive memory cell having a second parasitic resistance associated therewith, which is greater than the first parasitic resistance. The word line driver may include a voltage generator, which is configured to generate the word line program voltages in response to multi-bit program voltage control signals generated by the control circuit during the operations to program the array with write data. The word line driver may also include a row decoder, which is electrically coupled to the plurality of word lines. This word line driver is responsive to the word line program voltages generated by the voltage generator and address signals generated by the control circuit.

According to additional embodiments of the invention, a method of programming an integrated circuit memory device having an array of resistive memory cells therein, is provided. This method includes programming a first resistive memory cell in the array to a first logic level by driving a first word line connected to the first resistive memory cell with a first program voltage concurrently with passing a first cell current through the first resistive memory cell and to a first bit line associated with the first resistive memory cell. This method also includes programming a second resistive memory cell in the array to the first logic level by driving the first word line connected to the second resistive memory cell with a second programming voltage, which is greater than the first program voltage, concurrently with passing a second cell current through the second resistive memory cell and to a second bit line associated with the second resistive memory cell. The method may further include programming a third resistive memory cell in the array to the first logic level by driving the first word line connected to the third resistive memory cell with a third programming voltage, which is greater than the first and second program voltages, concurrently with passing a third cell current through the third resistive memory cell and to a third bit line associated with the third resistive memory cell. In addition, in some of these embodiments, the first, second and third cell currents may be equivalent during the programming of the first, second and third resistive memory cells, respectively. The memory device may also include a word line decoder, which is electrically connected by the first word line to the first, second and third resistive memory cells. The first resistive memory cell may be closer to the word line decoder relative to the second resistive memory cell, which may be closer to the word line decoder relative to the third resistive memory cell.

According to another aspect of the inventive concept, there is provided a resistive memory device including a memory cell array including a plurality of memory cells, and a control circuit configured to generate a program voltage control signal corresponding to an address of a selected memory cell among the plurality of memory cells, based on a mapping table defining a parasitic resistance according to an address of each of the plurality of memory cells. A voltage generator is also provided, which is configured to generate a program voltage having a first program voltage level among a plurality of program voltage levels, based on the program voltage control signal. A row decoder may also be provided, which is configured to provide the program voltage to a selected word line connected to the selected memory cell.

According to another embodiment of the inventive concept, a resistive memory device is provided, which includes a memory cell array having a plurality of memory cells therein. A voltage generator is provided, which is configured to generate a program voltage corresponding to a first program voltage level among a plurality of program voltage levels, based on position information of a selected memory cell among the plurality of memory cells and a cell resistance distribution of the plurality of memory cells. A row decoder is provided, which is configured to provide the program voltage to a selected word line connected to the selected memory cell. A write circuit is provided, which is configured to provide a program current to a selected bit line connected to the selected memory cell.

According to another embodiment of the inventive concept, a resistive memory device is provided, which includes a memory cell array having a plurality of memory groups therein (with each group including a plurality of memory cells). A control circuit is provided, which is configured to store a mapping table. This mapping table is configured to define a parasitic resistance according to an address of each of the plurality of memory cells. The control circuit is further configured to generate a program voltage control signal corresponding to an address of a selected memory cell among the plurality of memory cells, based on the mapping table. A voltage generator is provided, which is configured to generate program voltage having a first program voltage level among a plurality of program voltage levels, based on the program voltage control signal. A row decoder is provided, which is configured to provide the program voltage to a selected word line connected to the selected memory cell. A write circuit is provided, which is configured to provide a program current to a selected bit line connected to the selected memory cell.

BRIEF DESCRIPTION OF THE DRAWINGS

Embodiments of the inventive concept will be more clearly understood from the following detailed description taken in conjunction with the accompanying drawings in which:

FIG. 2 illustrates a mapping table according to an embodiment;

DETAILED DESCRIPTION OF THE EMBODIMENTS

Hereinafter, embodiments of the inventive concept will be described in detail with reference to the accompanying drawings.

Figure 1:
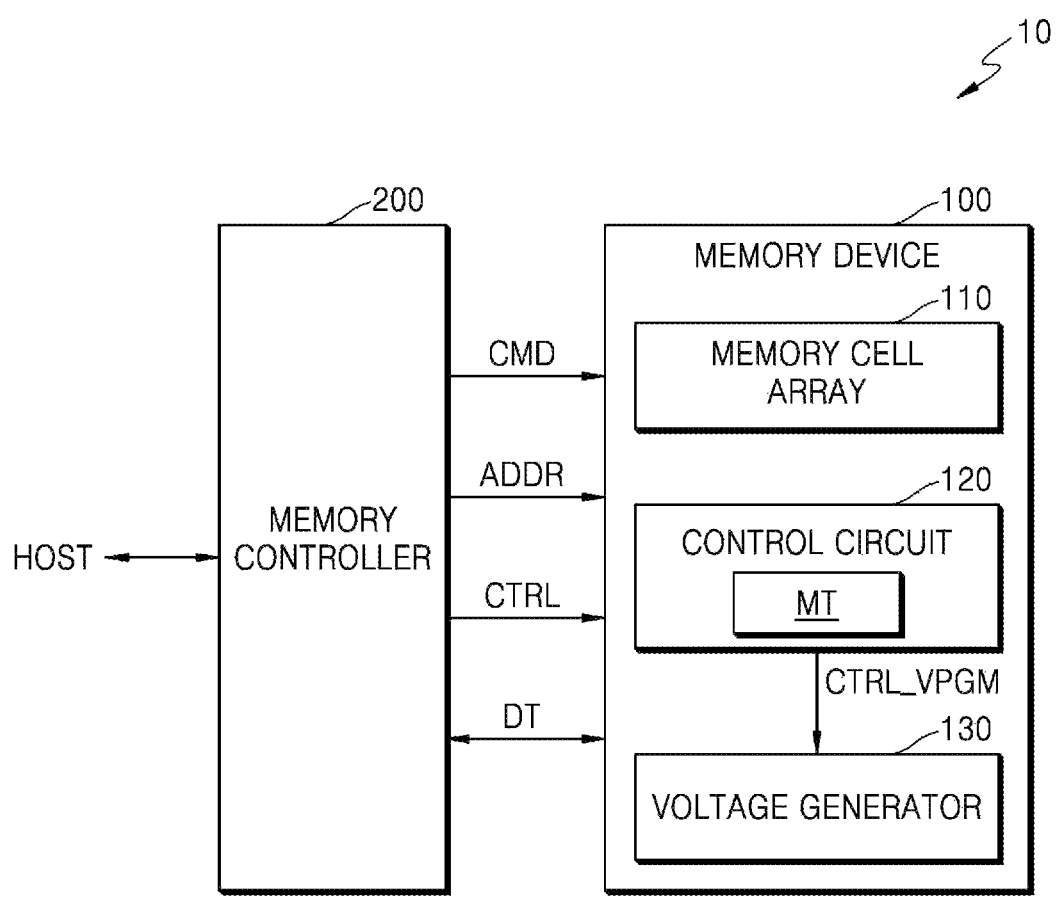
FIG. 1 is a block diagram of a memory system according to an embodiment.

FIG. 1 is a block diagram of a memory system 10 according to an embodiment.

Referring to FIG. 1, the memory system 10 may include a memory device 100 and a memory controller 200. The memory device 100 may be a non-volatile memory device. The memory device 100 may include a memory cell array 110, a control circuit 120, and a voltage generator 130. The memory cell array 110 may include a plurality of resistive memory cells. Accordingly, the memory device 100 may be referred to as a "resistive memory device". For convenience, the resistive memory cell is referred to as a "memory cell", and the resistive memory device is referred to as a "memory device".

The memory controller 200 may control the memory device 100 to read data stored in the memory device 100 or write data to the memory device 100 in response to a read/write request from a host. Specifically, the memory controller 200 may control read, write, and erase operations on the memory device 100 by providing an address ADDR, a command CMD, and a control signal CTRL to the memory device 100. In addition, data DT to be written or read data DT may be transmitted and received between the memory controller 200 and the memory device 100.

The memory cell array 110 may include a plurality of memory cells. The memory cells may be respectively disposed in regions in which a plurality of word lines and a plurality of bit lines cross each other. Accordingly, the memory device 100 may be referred to as a "cross point memory". Hereinafter, the memory cell to perform the write operation among the memory cells is referred to as a "selected memory cell". A parasitic resistance of the selected memory cell may be different according to a position of the selected memory cell in the memory cell array 110. Specifically, a length of a conductive line between the selected memory cell and the driving circuit (for example, a word line select switch or a bit line select switch) may be different according to the position of the selected memory cell, and a parasitic resistance may be different accordingly.

The memory cell array 110 may include a plurality of memory cells. For example, the memory cells may include resistive memory cells including variable resistance elements. For example, when the variable resistance element includes a phase change material (Ge—Sb—Te (GST)) and has a resistance changing according to a temperature, the memory device 100 may be a phase-change random access memory (PRAM). As another example, when the variable resistance element includes an upper electrode, a lower electrode, and a complex metal oxide therebetween, the memory device 100 may be a resistive random access memory (ReRAM). As another example, when the variable resistance element includes a magnetic upper electrode, a magnetic lower electrode, and a dielectric therebetween, the memory device 100 may be a magnetic random access memory (MRAM). Hereinafter, an embodiment in which the memory device 100 is a PRAM will be described.

The control circuit 120 may generate a program voltage control signal CTRL_VPGM for adjusting a program voltage of a selected memory cell in response to a write command and an address ADDR. In one embodiment, the control circuit 120 may generate the program voltage control signal CTRL_VPGM corresponding to the address of the selected memory cell based on a mapping table MT. In one embodiment, the mapping table MT may define a parasitic resistance corresponding to an address ADDR of each of the memory cells. For example, the mapping table MT may be stored in a register of the control circuit 120. However, embodiments of the inventive concept are not limited thereto. The mapping table MT may be stored in the outside of the control circuit 120, for example, an anti-fuse.

FIG. 2 illustrates a mapping table MTa according to an embodiment.

Referring to FIG. 2, the mapping table MTa may correspond to an example of the mapping table MT of FIG. 1. The memory cell array 110 may be divided into a plurality of memory groups. The mapping table MTa may be defined with respect to one memory group and may be commonly applied to the memory groups. In one embodiment, the mapping table MTa may store a corresponding region or parasitic resistance based on coordinates (for example, X_ADDR in FIG. 3) from 1 to i according to an X-axis direction and coordinates (for example, Y_ADDR in FIG. 3) from 1 to j according to a Y-axis direction in one memory group.

In one embodiment, the coordinates according to the X-axis direction may set a distance from the driving circuit (for example, the word line select switch) as a reference, and the coordinates according to the Y-axis direction may set a distance from the driving circuit (for example, the bit line select switch) as a reference. As the distance from the driving circuit decreases, the parasitic resistance of the memory cell may be smaller, and as the distance from the driving circuit increases, the parasitic resistance of the memory cell may be larger.

According to the mapping table MTa, the memory group may be divided into first to $n^{th}$ regions A1 to An, and parasitic resistances of memory cells included in different regions may be different. For example, the parasitic resistances of the memory cells included in the first region A1 may be determined as a first parasitic resistance Rpara1, and the parasitic resistances of the memory cells included in the second region A2 may be determined as a second parasitic resistance Rpara2. The first parasitic resistance Rpara1 may be different from the second parasitic resistance Rpara2. For example, the first parasitic resistance Rpara1 may be smaller than the second parasitic resistance Rpara2.

However, embodiments of the inventive concept are not limited thereto. In another embodiment, the mapping table may store a corresponding program voltage or program voltage control signal based on coordinates (for example, X_ADDR in FIG. 3) from 1 to i according to the X-axis direction and coordinates (for example, Y_ADDR in FIG. 3) from 1 to j according to the Y-axis direction in one memory group. For example, the program voltages of the memory cells included in the first region A1 may be determined as a first program voltage, and the program voltages of the memory cells included in the second region A2 may be determined as a second program voltage. The first program voltage may be different from the second program voltage. For example, a voltage level of the first program voltage may be higher than a voltage level of the second program voltage.

Referring to FIG. 1 again, the voltage generator 130 may generate a program voltage having a first program voltage level, which is one of a plurality of program voltage levels, based on the program voltage control signal CTRL_VPGM. The plurality of program voltage levels may correspond to a plurality of predefined parasitic resistances. Accordingly, the number of program voltage levels may correspond to the number of parasitic resistances stored in the mapping table MT. In this manner, the voltage generator 130 may generate the program voltage corresponding to the first program voltage level among the program voltage levels based on position information of the selected memory cell among the memory cells and the cell resistance distribution of the memory cells. In one embodiment, the voltage generator 130 may generate the program voltage before the program operation of the memory cell array 110 is started. In other words, the program voltage may be set before a program current is applied to the selected memory cell.

According to the embodiment, the position of the selected memory cell may be compensated for by performing the program operation by using the program voltage according to the address of the selected memory cell. Specifically, input power of the selected memory cell, that is, Joule's heat, may be constantly maintained by adjusting the program voltage according to the address of the selected memory cell. Therefore, the performance degradation of the write operation caused by the parasitic resistance according to the position of the selected memory cell may be prevented, and the durability of the memory device 100 may be improved.

In some embodiments, the memory system 10 may be implemented by an internal memory embedded in an electronic device. For example, the memory system 10 may be a universal flash storage (UFS) memory device, an embedded multimedia card (eMMC), or a solid state drive (SSD). In some embodiment, the memory system 10 may be implemented by an external memory detachable from an electronic device. For example, the memory system 10 may include a UFS memory card, a compact flash (CF) card, a secure digital (SD) card, a micro secure digital (micro-SD) card, a mini secure digital (mini-SD) card, an extreme digital (xD) card, or a memory stick.

Figure 3:
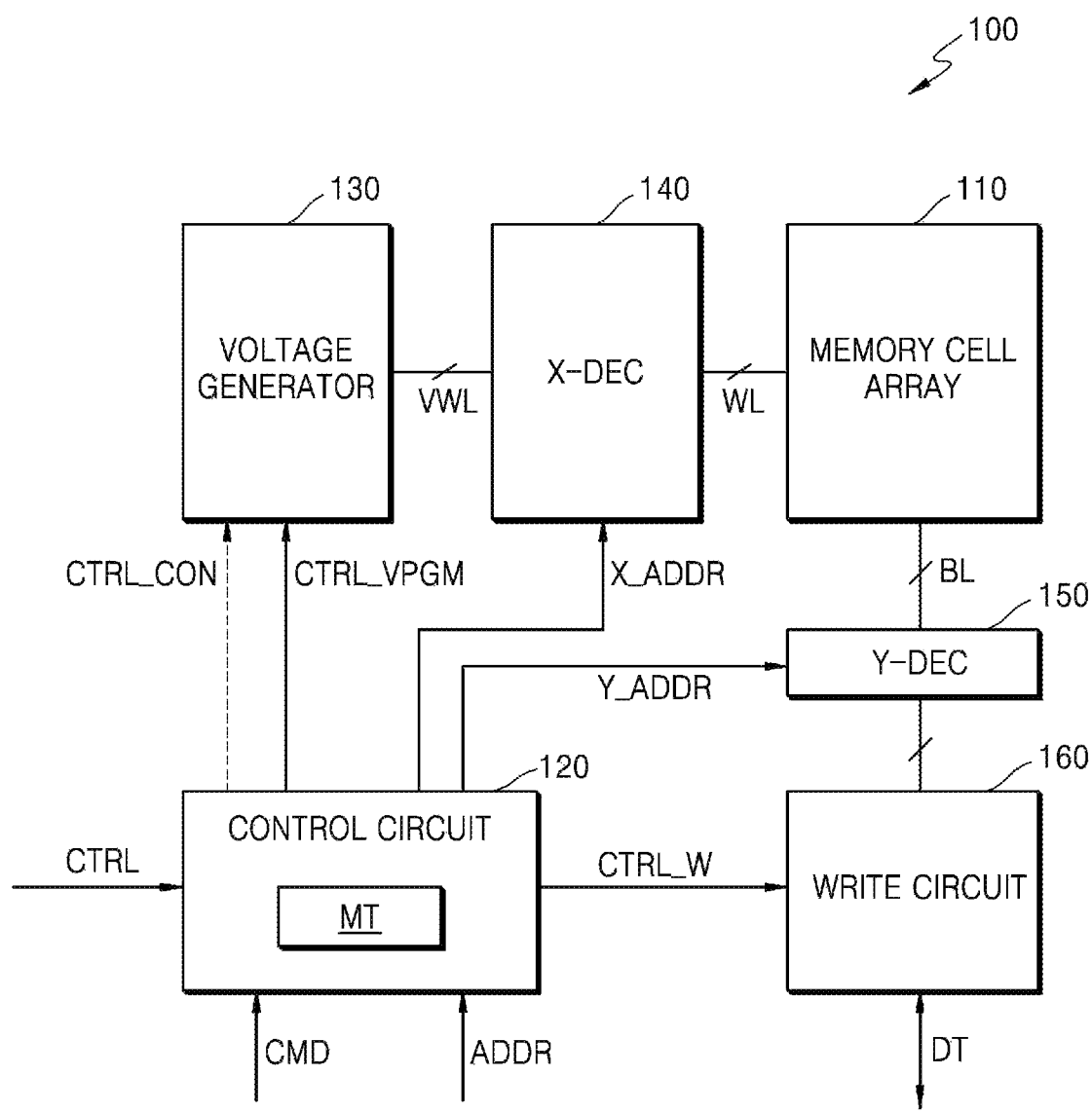
FIG. 3 is a block diagram of a memory device according to an embodiment.

FIG. 3 is a block diagram of a memory device 100 according to an embodiment.

Referring to FIG. 3, the memory device 100 may include the memory cell array 110, a control circuit 120, a voltage generator 130, a row decoder 140, a column decoder 150, and a write circuit 160. For example, the memory device 100 may correspond to the memory device 100 of FIG. 1. Although not illustrated, the memory device 100 may further include a data input and output circuit, an input and output interface, or the like.

The memory cell array 110 may be connected to the row decoder 140 through word lines WL, and may be connected to the column decoder 150 through bit lines BL. The memory cell array 110 may include a plurality of memory groups. In one or more embodiments, the memory group may be variously defined as a bank, a bay, a tile, a sub tile, or the like.

The control circuit 120 may output various control signals, for example, a program voltage control signal CTRL_VPGM, a row address X_ADDR, a column address Y_ADDR, and a write control signal CTRL_W, so as to program data in the memory cell array 110, read data from the memory cell array 110, or erase data stored in the memory cell array 110, based on a command CMD, an address ADDR, and a control CTRL. In this manner, the control circuit 120 may control the overall operation of the memory device 100. In addition, although not illustrated, the control circuit 120 may further output a read control signal or a read voltage control signal.

In one embodiment, the control circuit 120 may generate the program voltage control signal CTRL_VPGM in response to the write command and the address ADDR. Specifically, the control circuit 120 may select the region or parasitic resistance corresponding to the address ADDR based on the mapping table MT, and generate the program voltage control signal CTRL_VPGM corresponding to the selected region or parasitic resistance. For example, the control circuit 120 may generate the program voltage control signal CTRL_VPGM so that the program voltage is increased as the parasitic resistance is lower, and the program voltage is decreased as the parasitic resistance is higher.

In one embodiment, the control circuit 120 may further generate a connection control signal CTRL_CON for activating the voltage generator 130 in response to the write command. The control circuit 120 may provide the connection control signal CTRL_CON to the voltage generator 130 and then provide the program voltage control signal CTRL_VPGM to the voltage generator 130. When the connection control signal CTRL_CON is activated, a current path in the voltage generator 130 may be activated.

The voltage generator 130 may generate various types of voltages for performing program, read, and erase operations on the memory cell array 110, based on various voltage control signals received from the control circuit 120. Specifically, the voltage generator 130 may generate a word line voltage VWL, for example, a program voltage, a read voltage, a pass voltage, an erase verify voltage, or a program verify voltage.

In one embodiment, a plurality of program voltage levels may be preset, and the voltage generator 130 may generate a program voltage having a first program voltage level, which is one of the program voltage levels, in response to the program voltage control signal CTRL_VPGM. Accordingly, the program voltage may be variable according to the position of the selected memory cell in the memory cell array 110, that is, the address of the selected memory cell. In this case, the first program voltage level may be increased as the parasitic resistance is smaller. For example, in the case of the mapping table MTa of FIG. 2, the program voltage level for programming the memory cells included in the first region A1 is highest, and the program voltage level for programming the memory cells included in the $n^{th}$ region An may be lowest.

The row decoder 140 may select one of a plurality of word lines WL in response to the row address X_ADDR. For example, the row decoder 140 may include a plurality of word line select switches or row select switches respectively connected to a plurality of word lines WL. The row select switches may be driven in response to the row address X_ADDR. The row decoder 140 may be configured to provide the program voltage to a selected word line connected to the selected memory cell among the word lines WL.

The column decoder 150 may select one of a plurality of bit lines BL in response to the column address Y_ADDR. For example, the column decoder 150 may include a plurality of bit line select switches or column select switches respectively connected to a plurality of bit lines BL. The column select switches may be driven in response to the column address Y_ADDR. The column decoder 150 may be configured so that a selected bit line connected to the selected memory cell among the bit lines BL is electrically connected to the write circuit 160.

The write circuit 160 may be configured to receive a write control signal CTRL_W from the control circuit 120, and provide a program current to the selected bit line in response to the write control signal CTRL_W. In one embodiment, the program current may have a fixed value. In one or more embodiments, the write circuit 160 may be referred to as a write driver. Although not illustrated, the memory device 100 may further include a read circuit. The read circuit may include a sense amplifier that amplifies data read from the selected memory cell.

Figure 4:
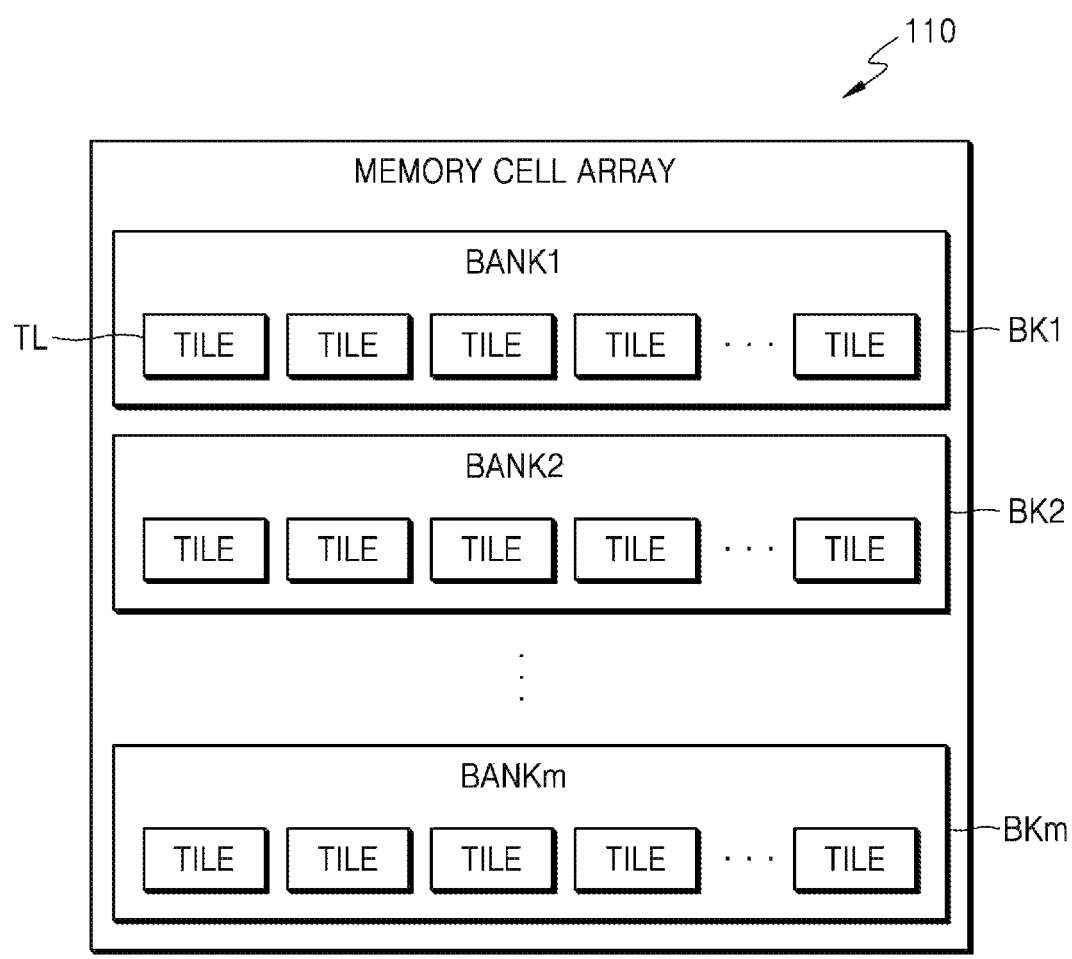
FIG. 4 is a block diagram of a memory cell array according to an embodiment.

FIG. 4 is a block diagram of a memory cell array 110 according to an embodiment.

Referring to FIG. 4, the memory cell array 110 may include a plurality of banks BK1, BK2, and BKm. For example, the banks BK1, BK2, and BKm may be arranged in one direction in the memory cell array 110. For example, the memory cell array 110 may include m banks, wherein m is an integer of 2 or more. The banks BK1, BK2, and BKm may each include a plurality of tiles TL. In one embodiment, the memory group may correspond to the bank. In one or more embodiments, the memory group may correspond to the tile. In one or more embodiments, the memory group may correspond to a bay. The bay may include a plurality of tiles, and the bank may include a plurality bays.

Figure 5:
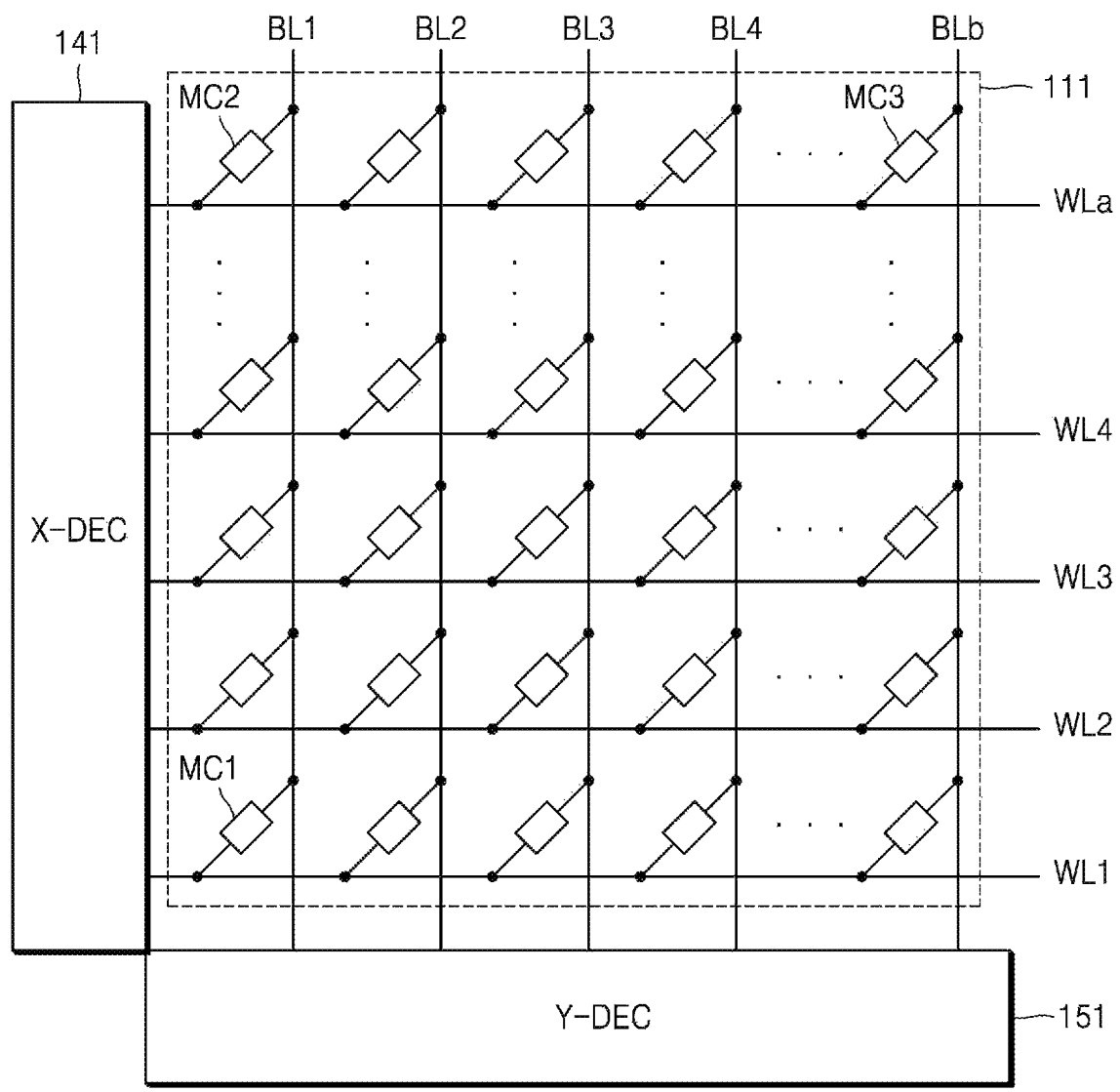
FIG. 5 illustrates a memory group according to an embodiment.

FIG. 5 illustrates a memory group 111 according to an embodiment. Referring to FIG. 5, the memory may include a plurality of word lines WL1 to WLa, a plurality of bit lines BL1 to BLb, and a plurality of memory cells MC. The memory cells MC may be respectively arranged in regions in which the word lines WL1 to WLa and the bit lines BL1 to BLb cross each other, where "a" and "b" may each be a positive integer. In one embodiment, a and b may be different from each other. However, embodiments of the inventive concept are not limited thereto. In one or more embodiments, a and b may be identical to each other.

The memory group 111 may be disposed adjacent to the row decoder 141 in a first direction (for example, X direction), and may be disposed adjacent to the column decoder 151 in a second direction (for example, Y direction). As such, the memory group 111 defined with the row decoder 141 and the column decoder 151 may be referred to as a "tile". The tile may be defined based on the row decoder 141 commonly connected to the word lines WL1 to WLa and the column decoder 151 commonly connected to the bit lines BL1 to BLb. The parasitic resistance of the memory cell MC may be different according to the position of the memory cell MC in the memory group 111.

The first memory cell MC1 may be disposed in a region in which the first word line WL1 and the first bit line BL1 cross each other, and the second memory cell MC2 may be disposed in a region in which the $a^{th}$ word line WLa and the first bit line BL1 cross each other. In this case, the distances between the first and second memory cells MC1 and MC2 and the row decoder 141 may be substantially the same as each other, but the distance between the second memory cell MC2 and the column decoder 151 is longer than the distance between the first memory cell MC1 and the column decoder 151. Therefore, during the write operation, the parasitic resistance of the second memory cell MC2 may be greater than the parasitic resistance of the first memory cell MC1.

In addition, the third memory cell MC3 may be disposed in a region in which the $a^{th}$ word line WLa and the $b^{th}$ bit line cross each other. In this case, the distances between the second and third memory cells MC2 and MC3 and the column decoder 151 may be substantially the same as each other, but the distance between the third memory cell MC3 and the row decoder 141 is longer than the distance between the second memory cell MC2 and the row decoder 141. Therefore, during the write operation, the parasitic resistance of the third memory cell MC3 may be greater than the parasitic resistance of the second memory cell MC2.

Figure 6A:
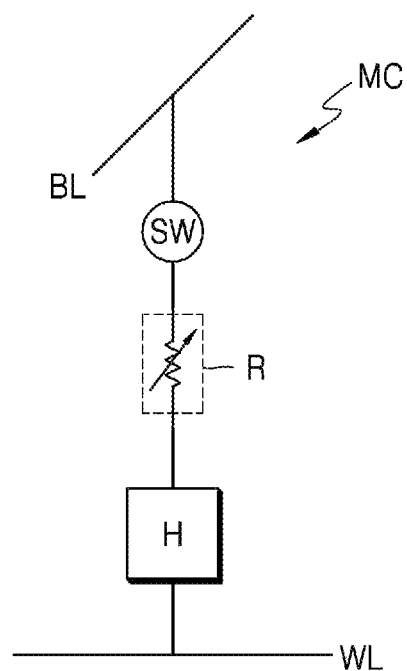
FIGS. 6A to 6C illustrate examples of memory cells according to one or more embodiments.
Figure 6B:
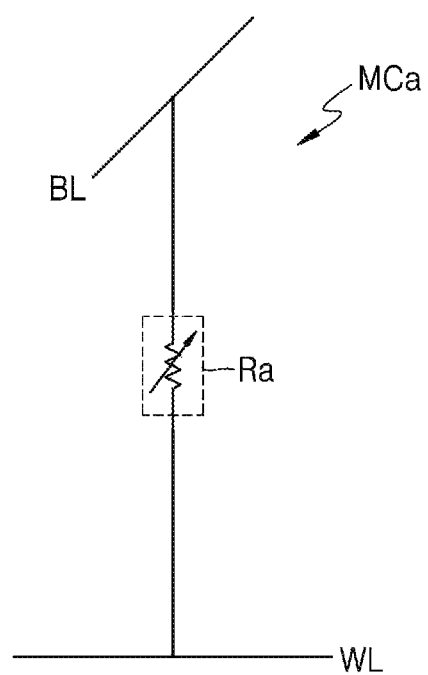
Figure 6C:
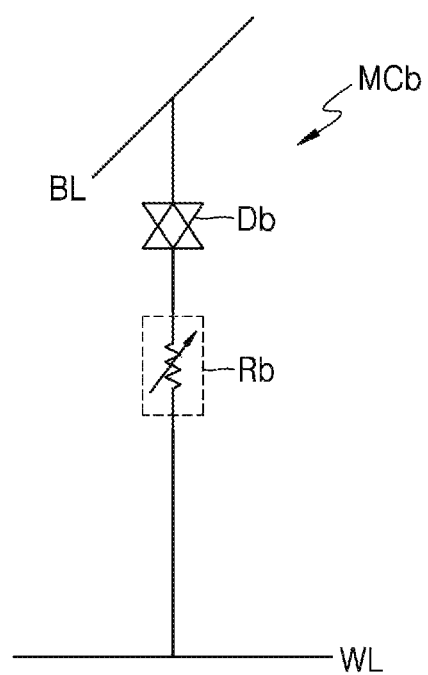

FIGS. 6A to 6C illustrate examples of memory cells MC, MCa, and MCb according to one or more embodiments.

Referring to FIG. 6A, the memory cell MC may include a variable resistance element R, a select element SW, and a heating element H. The variable resistance element R may be referred to as a variable resistor or a variable resistance material, and the select element SW may be referred to as a switching element. In addition, the heating element H may be referred to as a heating electrode or a heating electrode layer.

In one embodiment, the variable resistance element R may be connected between the select element SW and the heating element H. The select element SW may be connected to the bit line BL. The heating element H may be connected to the word line WL. In other words, one end of the select element SW may be connected to the bit line BL, and the other end of the select element SW may be connected to the variable resistance element R. In addition, one end of the heating element H may be connected to the word line WL, and the other end of the heating element H may be connected to the variable resistance element R.

The variable resistance element R may be changed to one of a plurality of resistance states by an applied electric pulse (for example, program current). According to an example embodiment, the variable resistance element R may include a phase-change material, a crystal state of which is changed according to an amount of current. The phase-change material may use various types of materials, for example, GaSb, InSb, InSe, $Sb_2Te_3$, and GeTe, in which two elements are combined, GeSbTe(GST), GaSeTe, InSbTe, $SnSb_2Te_4$, and InSbGe, in which three elements are combined, and AgInSbTe, (GeSn)SbTe, GeSb(SeTe), and $Te_{81}Ge_{15}Sb_2S_2$, in which four elements are combined.

The phase-change material may have an amorphous state having a relatively high resistance and a crystal state having a relatively low resistance. The phase of the phase-change material may be changed by Joule's heat generated according to the amount of current. Data may be written by using the phase change. For example, data may be stored in the variable resistance element R by defining a high resistance state or a reset state as "0" and a low resistance state or a set state as "1".

Meanwhile, in one or more embodiments, the variable resistance element R may include perovskite compounds, transition metal oxides, magnetic materials, ferromagnetic materials, or antiferromagnetic materials, instead of the phase-change material.

The select element SW may control the current supply to the variable resistance element R according to the voltage or current applied to the connected word line WL. The select element SW may be an ovonic threshold switch (OTS) including a chalcogenide compound. The ovonic threshold switch may include a material including arsenic (AS), germanium (Ge), selenium (Se), tellurium (Te), silicon (Si), bismuth (Bi), sulfur (S), and stibium (Sb). In particular, the ovonic threshold switch may include a six-element material in which selenium (Se) and sulfur (S) are added to a composite including germanium (Ge), silicon (Si), arsenic (As), and tellurium (Te).

The heating element H may heat the variable resistance element R during the data write operation (for example, the reset or set operation). The heating element H may include a conductive material capable of generating sufficient heat to phase-change the variable resistance element without reacting with the variable resistance element R. For example, the heating element H may include a carbon-based conductive material.

In example embodiments, the heating element H may include a high melting point metal or a nitride thereof, such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), and tantalum carbon nitride (TaCN).

Referring to FIG. 6B, a memory cell MCa may include a variable resistance element Ra, and the variable resistance element Ra may be connected between a bit line BL and a word line WL. The memory cell MCa may store data by a program current applied through the bit line BL. In addition, data stored in the memory cell MCa may be read by a read current applied through the word line WL.

Referring to FIG. 6C, a memory cell MCb may include a variable resistance element Rb and a bidirectional diode Db. The variable resistance element Rb may include a resistance material for storing data. The bidirectional diode Db may be connected between the variable resistance element Rb and a bit line BL, and the variable resistance element Rb may be connected to a word line WL and the bidirectional diode Db. The bidirectional diode Db may block a leakage current flowing through a non-selected resistive memory cell.

Figure 7A:
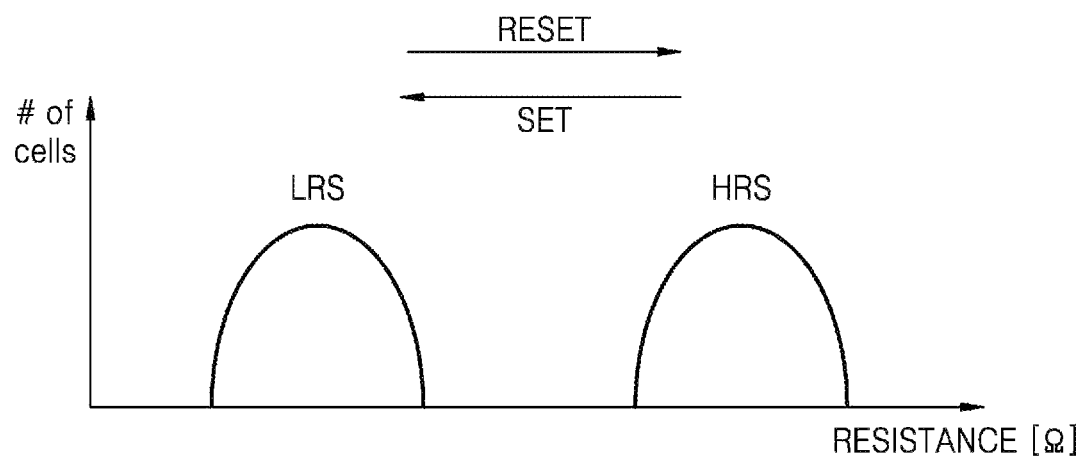
FIGS. 7A and 7B illustrate resistance distributions of memory cells according to one or more embodiments.

FIG. 7A is a graph showing the distribution of memory cells MC according to a resistance when the memory cell MC of FIG. 5 is a single level cell (SLC).

Referring to FIG. 7A, a horizontal axis represents the resistance and a vertical axis represents the number of memory cells MC. For example, when the memory cell MC is a single level cell that is programmed with 1 bit, the memory cell MC may have a low resistance state LRS or a high resistance state HRS.

The low resistance state LRS and the high resistance state HRS may correspond to one of data "0" and data "1". In one embodiment, a resistance level (R) may increase in the order of data "0" to data "1". That is, the low resistance state LRS may correspond to data "0" and the high resistance state HRS may correspond to data "1".

An operation of switching the memory cell MC from the high resistance state HRS to the low resistance state LRS by applying the program current to the memory cell MC is referred to as a set operation or a set write operation. In addition, an operation of switching the memory cell MC from the low resistance state LRS to the high resistance state HRS by applying the program current to the memory cell MC is referred to as a reset operation or a reset write operation.

Figure 7B:
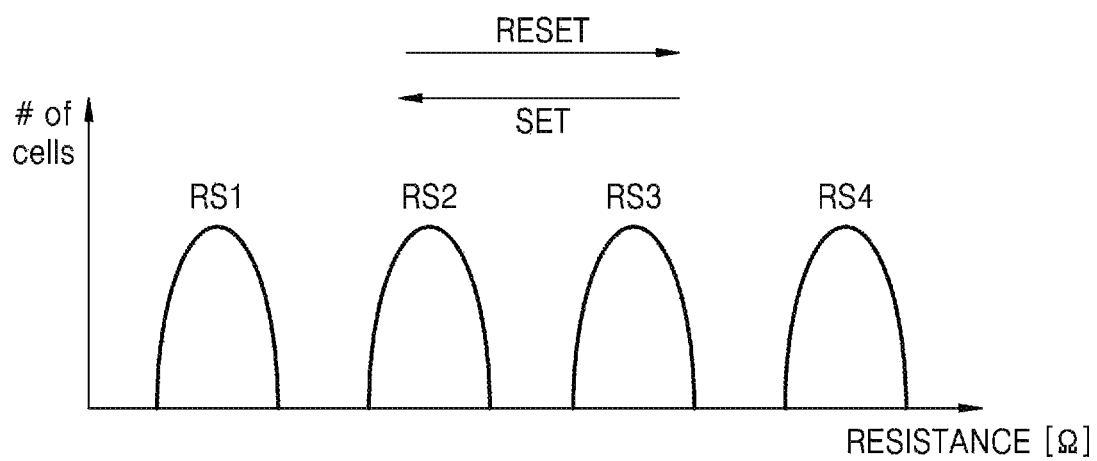

FIG. 7B is a graph showing the distribution of memory cells MC according to a resistance when the memory cell MC of FIG. 5 is a multi level cell (MLC).

Referring to FIG. 7B, a horizontal axis represents the resistance and a vertical axis represents the number of memory cells MC. For example, when the memory cell MC is a multi level cell that is programmed with 2 bits, the memory cell MC may have one of a first resistance state RS1, a second resistance state RS2, a third resistance state RS3, and a fourth resistance state RS4. However, embodiments of the inventive concept are not limited thereto. In one or more embodiments, a plurality of memory cells may include triple level cells (TLSs) each capable of storing 3-bit data and may have one of eight resistance states accordingly. In one or more embodiments, a plurality of memory cells may include memory cells each capable of storing 4-bit or more data.

Each of the resistance states RS1, RS2, RS3, and RS4 may correspond to one of data "00", data "01", data "10", and data "11". In one embodiment, a resistance level (R) may increase in the order of data "11", data "01", data "00", and data "10". That is, the first resistance state RS1 may correspond to data "11", the second resistance state RS2 may correspond to data "01", the third resistance state RS3 may correspond to data "00", and the fourth resistance state RS4 may correspond to data "10".

Figure 8:
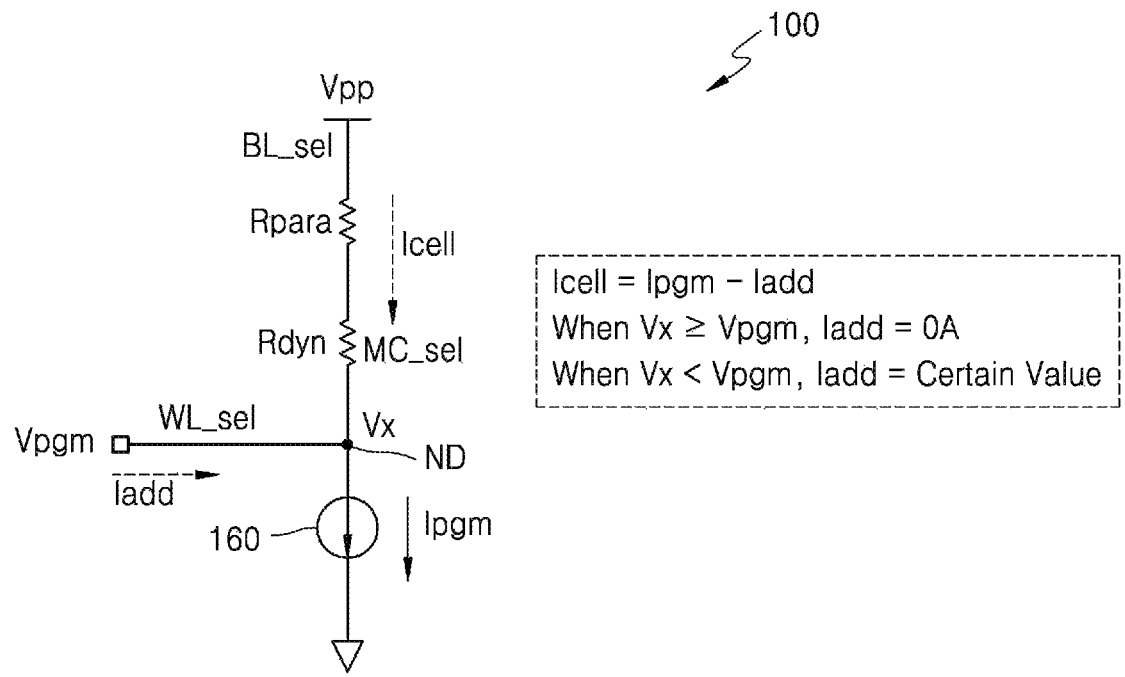
FIG. 8 illustrates a memory device modeled for describing a write operation, according to an embodiment.

FIG. 8 illustrates a memory device 100 modelled for describing a write operation, according to an embodiment.

Referring to FIGS. 3 and 8, during a write operation of a selected memory cell MC_sel, the row decoder 140 may select a selected word line WL_sel among a plurality of word lines, and a program voltage Vpgm generated by the voltage generator 130 may be applied to the selected word line WL_sel. In addition, during the write operation of the selected memory cell MC_sel, the column decoder 150 may select a selected bit line BL_sel among a plurality of bit lines, and the write circuit 160 may apply a program current Ipgm to the selected bit line BL_sel. As such, the selected memory cell MC_sel may be programmed by a "hybrid program method" using the program voltage Vpgm and the program current Ipgm.

A cell resistance Rdyn of the selected memory cell MC_sel may have a distribution with respect to a plurality of memory cells. In addition, a parasitic resistance Rpara may be generated according to a position of the selected memory cell MC_sel in the memory cell array 110. When the selected bit line BL_sel is connected to a voltage terminal Vpp, a voltage Vx of a node ND (hereinafter, referred to as a "node voltage") may be changed according to the cell resistance Rdyn and the parasitic resistance Rpara. Specifically, when a cell current Icell is constant, the node voltage Vx may decrease if the cell resistance Rdyn and the parasitic resistance Rpara increase, and the node voltage Vx may increase if the cell resistance Rdyn and the parasitic resistance Rpara decrease.

An additional current Iadd flowing through the selected word line WL_sel may be determined based on the program voltage Vpgm and the node voltage Vx. Specifically, when the node voltage Vx is higher than or equal to the program voltage Vpgm, the additional current Iadd may not flow and the additional current Iadd may be 0 A. Meanwhile, when the node voltage Vx is lower than the program voltage Vpgm, the additional current Iadd may flow and the additional current Iadd may have a specific value. Therefore, the cell current Icell flowing through the selected memory cell MC_sel may correspond to a difference between the program current Ipgm and the additional current Iadd (that is, Icell=Ipgm−Iadd).

When the additional current Iadd does not flow, the program current Ipgm may be expressed as Equation 1 below:

$$I_{pgm} = \frac{V_{pp} - V_x}{R_{para} + R_{dyn_{mid}}}.$$ [Equation 1]

Figure 10:
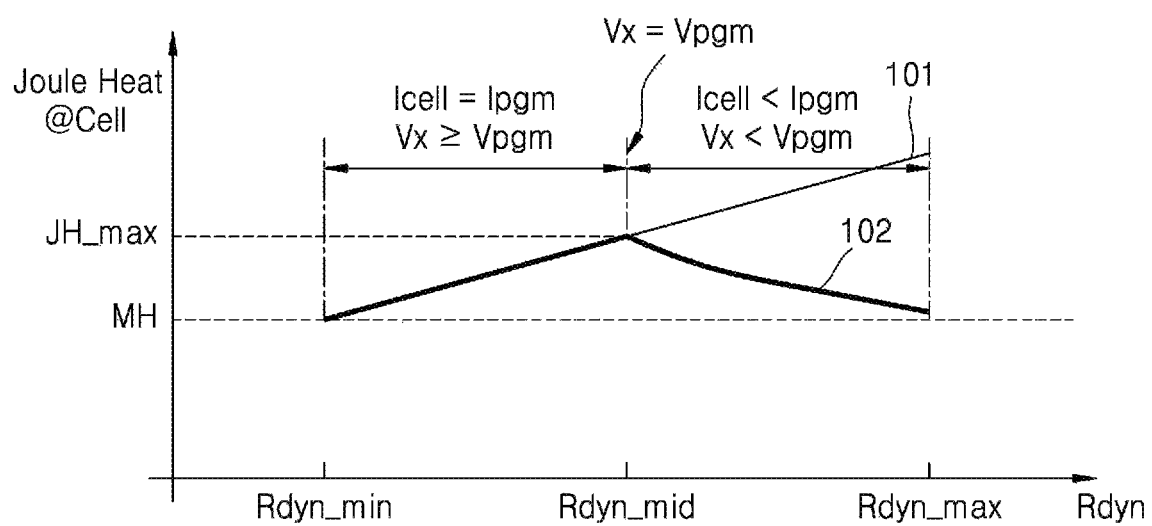
FIG. 10 illustrates input power based on a cell resistance distribution, according to an embodiment.

Rdyn_mid may correspond to a reference cell resistance, for example, Rdyn_mid of FIG. 10. From Equation 1, the node voltage Vx may be expressed as Equation 2 below.

$$V_x = V_{pp} - I_{pgm}(R_{para} + R_{dyn_{mid}}).$$ [Equation 2]

As such, when the voltage level of the voltage terminal Vpp and the program current Ipgm are constant, at least one of the parasitic resistance Rpara and the cell resistance Rdyn increases, the node voltage Vx decreases.

Figure 9:
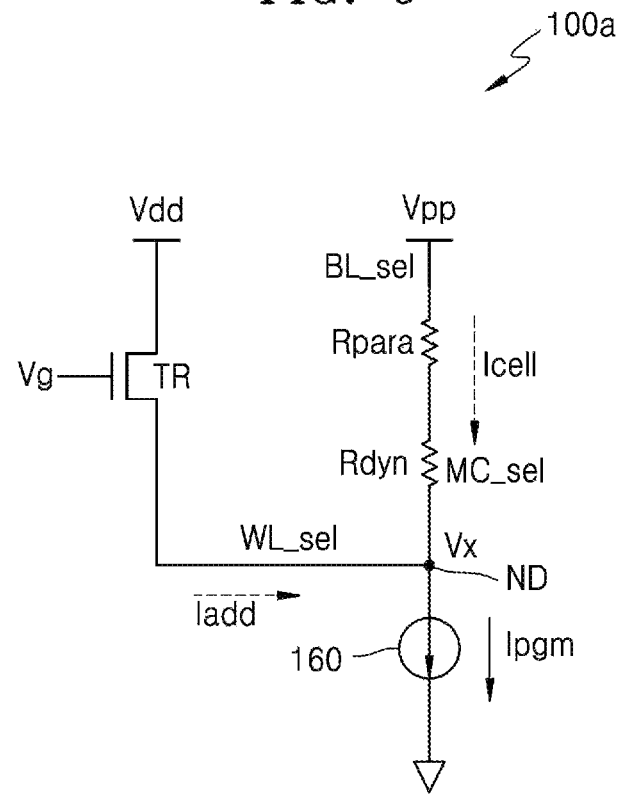
FIG. 9 illustrates a modification of the memory device of FIG. 8.

FIG. 9 illustrates a modification 100a of the memory device 100 of FIG. 8.

Referring to FIG. 9, the memory device 100a may further include a transistor TR as compared with the memory device 100 of FIG. 8. For example, the transistor TR may be an NMOS transistor, but embodiments of the inventive concept are not limited thereto. A gate voltage Vg may be applied to a gate of the transistor TR, a first terminal thereof may be connected to a node ND, and a second terminal thereof may be connected to a power supply voltage terminal Vdd.

In this case, the gate voltage Vg may correspond to the program voltage Vpgm. For example, the gate voltage Vg may correspond to the sum of the program voltage Vpgm and the threshold voltage Vth. When a difference between the gate voltage Vg and the node voltage Vx is greater than the threshold voltage Vth, the transistor may be turned on, and an additional current Iadd may have a specific value. Meanwhile, when a difference between the gate voltage Vg and the node voltage Vx is less than the threshold voltage Vth, the transistor may not be turned on, and no additional current Iadd may flow therethrough.

FIG. 10 illustrates input power based on a cell resistance distribution, according to an embodiment. Referring to FIG. 10, a horizontal axis represents a cell resistance Rdyn. A plurality of memory cells may have a cell resistance distribution from a minimum cell resistance Rdyn_min to a maximum cell resistance Rdyn_max. In one embodiment, a median of the maximum cell resistance Rdyn_max and the minimum cell resistance Rdyn_min of the memory cells may be determined as a reference resistance Rdyn_mid. Meanwhile, a horizontal axis represents input power per memory cell, that is, Joule heat. When input power that is greater than or equal to melting heat MH is applied to the memory cell, a program operation may be performed on the memory cell.

In one embodiment, a program current Ipgm may be determined based on the minimum cell resistance Rdyn_min. According to the Joule law, when a current I flows through a resistor R, energy $I^2*R$ consumed per unit time in a conductor all becomes heat, and heat generated at this time is "Joule heat". A cell current Icell may be determined based on the program current Ipgm. When the cell current Icell is constant, Joule heat increases as in the first graph 101 as the cell resistance Rdyn increases. Therefore, when the memory cell having a cell resistance greater than the minimum cell resistance Rdyn_min is programmed, input power may increase, and thus, the memory cell may be overprogrammed. In addition, as the number of times of programs on the memory cells increases, a damage to the memory cell may be accelerated.

However, according to embodiments of FIGS. 8 and 9, the cell current Icell may be determined based on the program current Ipgm and the cell resistance Rdyn. Specifically, when the cell resistance Rdyn is between the minimum cell resistance Rdyn_min and the reference cell resistance Rdyn_mid, the node voltage Vx may be higher than or equal to the program voltage Vpgm. Accordingly, since no additional current Iadd may flow, the cell current Icell may be equal to the program current Ipgm. Meanwhile, when the cell resistance Rdyn is between the reference cell resistance Rdyn_mid and the maximum cell resistance Rdyn_max, the node voltage Vx may be lower than the program voltage Vpgm. Accordingly, since the additional current Iadd may flow, the cell current Icell may be less than the program current Ipgm. Therefore, Joule heat due to the cell resistance distribution may have the form of a second graph 102. The memory cell having the maximum cell resistance Rdyn_max may not be overprogrammed. In addition, it is possible to prevent the damage to the memory cell from being accelerated.

The program voltage Vpgm may be determined so that a maximum value JH_max of input power of the plurality of memory cells has the lowest value. In one embodiment, since the input power of the memory cell having the reference cell resistance Rdyn_min may have the maximum value JH_max, the program voltage Vpgm may be determined so that the maximum value JH_max has the lowest value. Therefore, the second graph 102 may have substantially a flat shape.

However, during the write operation on the selected memory cell MC_sel, the input power of some memory cells may not have the form of the second graph 102 due to the parasitic resistance Rpara, in spite of the hybrid program method. Therefore, according to one or more embodiments, the program voltage Vpgm may be controlled according to the position of the selected memory cell MC_sel in the memory cell array 110. Therefore, the input power of the memory cells may have the form of the second graph 102. Details thereof will be described below with reference to FIGS. 11 to 17.

Figure 11:
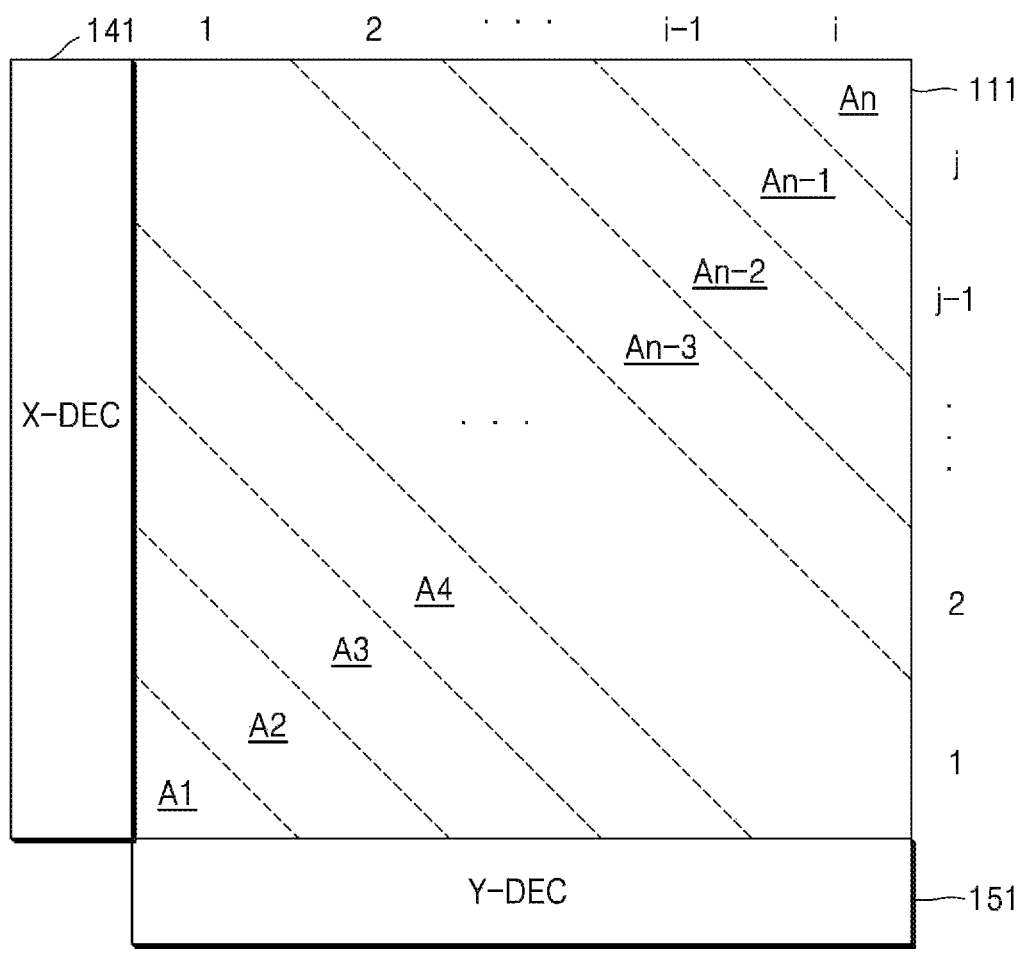
FIG. 11 illustrates an example in which the memory group of FIG. 5 is divided into a plurality of regions, according to an embodiment.

FIG. 11 illustrates an example in which the memory group 111 of FIG. 5 is divided into a plurality of regions, according to an embodiment.

Referring to FIGS. 2 and 11, the memory group 111 may be divided into first to $n^{th}$ regions A1 to An (n is an integer of 2 or more). The memory group 111 may be divided into, for example, coordinates from 1 to i in the X-axis direction and coordinates from 1 to j in the Y-axis direction according to the mapping table MTa. In this case, i may be an integer less than or equal to b in FIG. 5, and j may be an integer less than or equal to a in FIG. 5. The number of regions included in the memory group 111 may be determined according to Equation 3 below:

$$\frac{R_{para_{max}} - P_{para_{min}}}{n} \leq \frac{R_{dyn_{max}} - R_{dyn_{min}}}{2}. \quad \text{[Equation 3]}$$

Rdyn_max is the maximum cell resistance in FIG. 10, and Rdyn_min is the minimum cell resistance in FIG. 10. Rpara_max is the maximum parasitic resistance, and Rpara_min is the minimum parasitic resistance. For example, Rpara_max may correspond to the $n^{th}$ parasitic resistance Rpara_n of the mapping table MTa of FIG. 2, and Rpara_m in may correspond to the first parasitic resistance Rpara1 of the mapping table MTa of FIG. 2.

According to the mapping table MTa, the parasitic resistances of the memory cells included in the first region A1 may be determined by the first parasitic resistance Rpara1. In addition, the parasitic resistances of the memory cells included in the second region A2 may be determined by the second parasitic resistance Rpara2 that is greater than the first parasitic resistance Rpara1. As such, the parasitic resistances of the memory cells included in the memory group 111 may be differently determined for each region. In addition, the parasitic resistances of the memory cells included in the same region may be determined as the same parasitic resistance.

Figure 12:
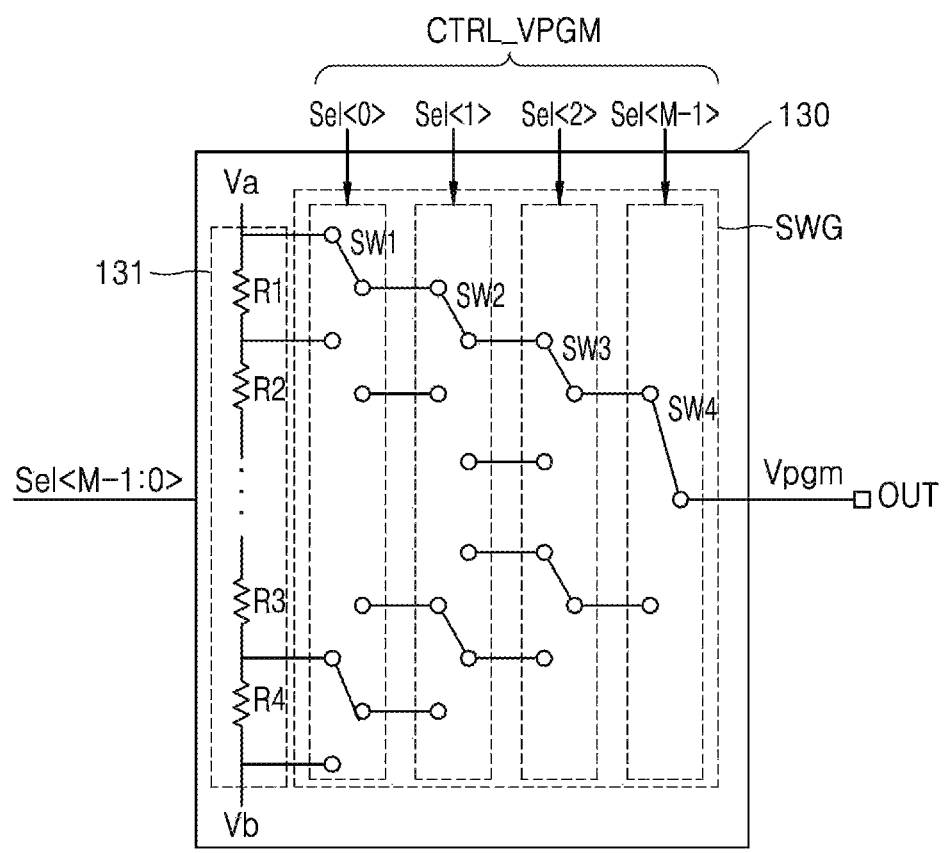
FIG. 12 illustrates a voltage generator according to an embodiment.

FIG. 12 illustrates a voltage generator 130 according to an embodiment.

Referring to FIG. 12, the voltage generator 130 may include a voltage divider 131 and a switch group SWG. The voltage divider 131 may include a plurality of resistors R1 to R4 connected in series. One end of the resistor R1 may be connected to a first voltage terminal Va, and one end of the resistor R4 may be connected to a second voltage terminal Vb. The voltage divider 131 may be configured to output a plurality of voltages respectively corresponding to a plurality of program voltage levels. In this case, the number of resistors included in the voltage divider 131 may correspond to the number of program voltage levels.

The switch group SWG may include a plurality of switches SW1 to SW4 connected between the voltage divider 131 and an output terminal OUT and turned on and off according to a program voltage control signal CTRL_VPGM. In one embodiment, the program voltage control signal CTRL_VPGM may be generated as an M-bit signal Sel<M−1:0> (M is a positive integer). When the memory group is divided into n sub-groups according to the mapping table, a value of M may be determined so that $2^M$ becomes n or more. For example, when n is 16, M may be 4. The first-stage switches SW1 may be driven in response to Sel<0>, the second-stage switches SW2 may be driven in response to Sel<1>, the third-stage switches SW3 may be driven in response to Sel<2>, and the fourth-stage switches SW4 may be driven in response to Sel<M−1>, that is, Sel<3>. The number of the stages of the switches may be determined by M.

Figure 13:
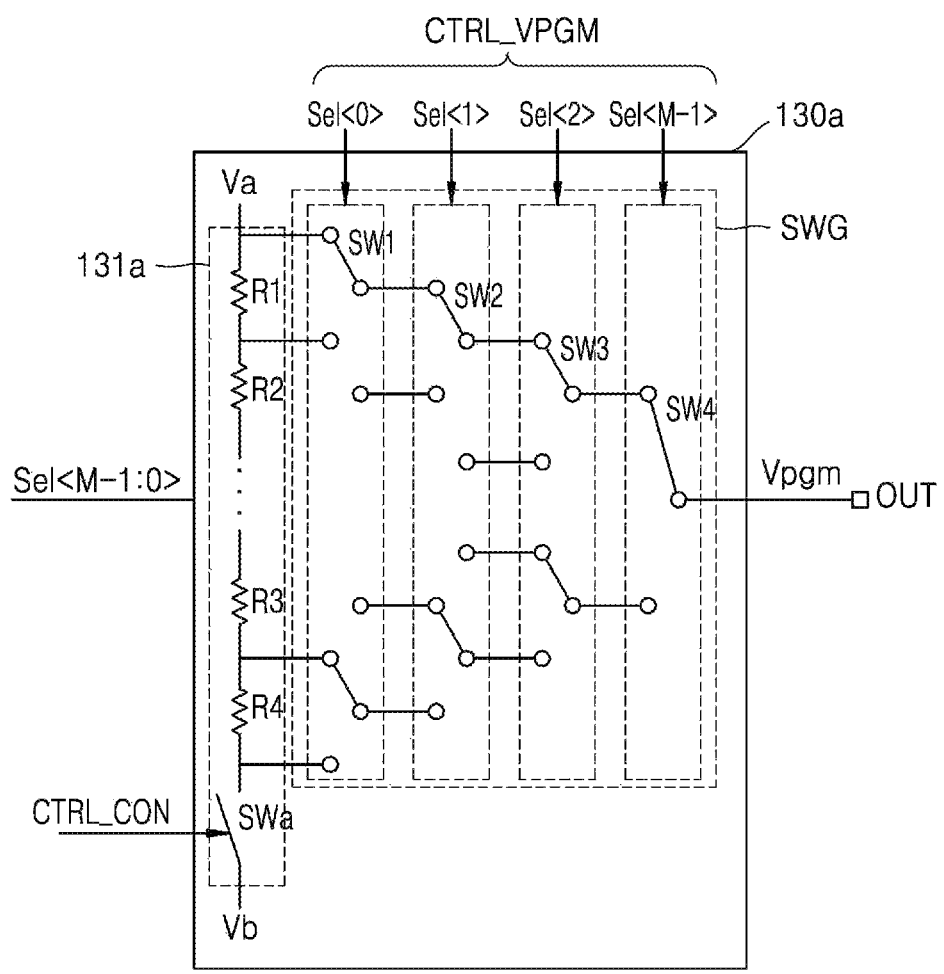
FIG. 13 illustrates a modification of the voltage generator of FIG. 12.

FIG. 13 illustrates a modification 130a of the voltage generator 130 of FIG. 12.

Referring to FIG. 13, the voltage generator 130a may further include a switch SWa as compared with the voltage generator 130 of FIG. 12. The voltage generator 130a may further include a connection control signal CTRL_CON from the control circuit 120. In one embodiment, the control circuit 120 may activate the connection control signal CTRL_CON when the write command is received from the memory controller. In one embodiment, the control circuit 120 may activate the connection control signal CTRL_CON when power is supplied to memory device 100. In one embodiment, the control circuit 120 may activate the connection control signal CTRL_CON before the write operation is enabled.

When the connection control signal CTRL_CON is activated, the switch SWa may be turned on, and a plurality of resistors R1 to R4 and first and second voltage terminals Va and Vb may be connected to each other. Therefore, a current path of a voltage divider 131a may be activated, and the voltage generator 130a may be set to output a program voltage Vpgm.

Figure 14:
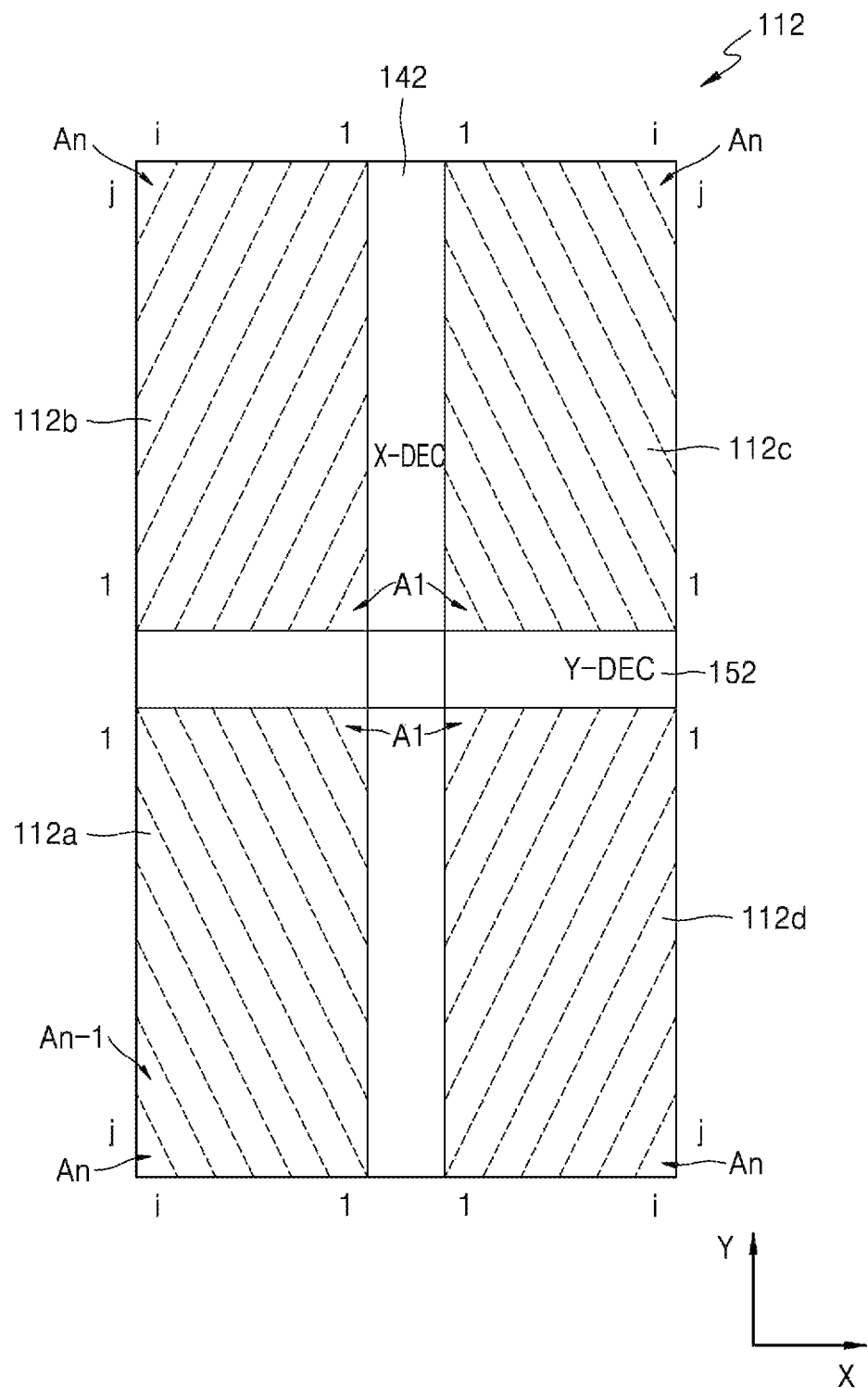
FIGS. 14 to 16 illustrate memory groups divided into a plurality of regions, according to one or more embodiments.

FIG. 14 illustrates a memory group 112 divided into a plurality of regions, according to an embodiment.

Referring to FIG. 14, the memory group 112 may be divided into first to fourth sub-groups 112a to 112d. For example, the memory group 112 may correspond to a "tile", and the first to fourth sub-groups 112a to 112d may correspond to "sub-tiles". A row decoder 142 may be disposed in the middle of the memory group 112 in a second direction (Y-axis direction), and a column decoder 152 may be disposed in the middle of the memory group 112 in a first direction (X-axis direction).

The first to fourth sub-groups 112a to 112d may be connected to the row decoder 142 and the column decoder 152. For example, the first to fourth sub-groups 112a to 112d may be divided into first to $n^{th}$ regions A1 to An according to the mapping table MTa of FIG. 2.

X coordinate of the first sub-group 112a may be defined from 1 to i based on the distance from the row decoder 142, and Y coordinate of the first sub-group 112a may be defined from 1 to j based on the distance from the column decoder 152. Therefore, the first sub-group 112a may be divided into the first to $n^{th}$ regions A1 to An. Similarly, X coordinate of the second sub-group 112b may be defined from 1 to i based on the distance from the row decoder 142, and Y coordinate of the second sub-group 112b may be defined from 1 to j based on the distance from the column decoder 152. Therefore, the second sub-group 112b may be divided into the first to $n^{th}$ regions A1 to An.

Figure 15:
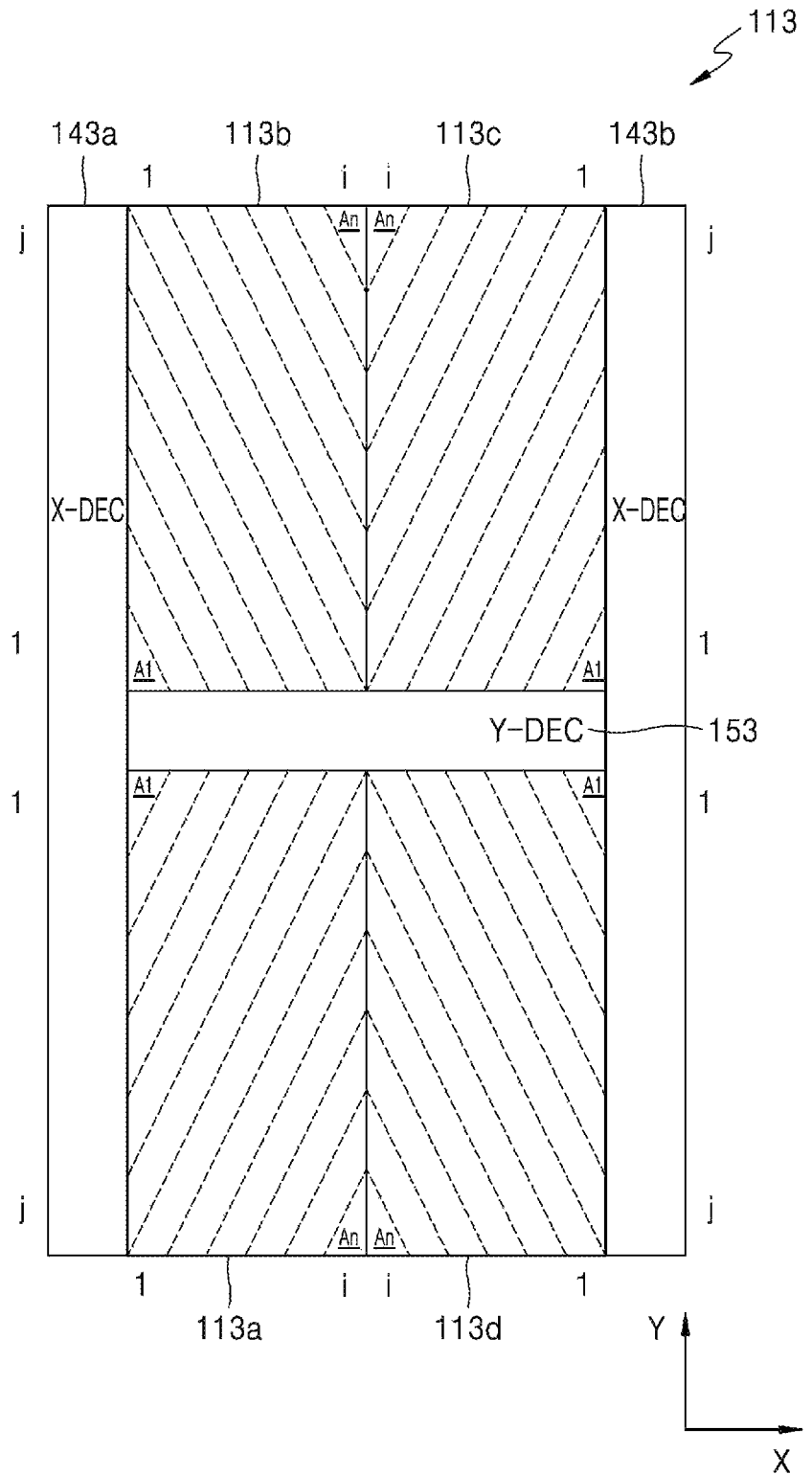

FIG. 15 illustrates a memory group 113 divided into a plurality of regions, according to an embodiment. Referring to FIG. 15, the memory group 113 may be divided into first to fourth sub-groups 113a to 113d. For example, the memory group 113 may correspond to a "tile", and the first to fourth sub-groups 113a to 113d may correspond to "sub-tiles". First and second row decoders 143a and 143b may be disposed on the left and right sides of the memory group 112 in a second direction (Y-axis direction), and a column decoder 153 may be disposed in the middle of the memory group 113 in a first direction (X-axis direction).

The first and second sub-groups 113a and 113b may be connected to the first row decoder 143a and the column decoder 153, and the third and fourth sub-groups 113c and 113d may be connected to the second row decoder 143b and the column decoder 153. For example, the first to fourth sub-groups 113a to 113d may be divided into first to $n^{th}$ regions A1 to An according to the mapping table MTa of FIG. 2.

X coordinate of the first sub-group 113a may be defined from 1 to i based on the distance from the first row decoder 143a, and Y coordinate of the first sub-group 113a may be defined from 1 to j based on the distance from the column decoder 153. Therefore, the first sub-group 113a may be divided into the first to $n^{th}$ regions A1 to An. Similarly, X coordinate of the second sub-group 113b may be defined from 1 to i based on the distance from the first row decoder 143a, and Y coordinate of the second sub-group 113b may be defined from 1 to j based on the distance from the column decoder 153. Therefore, the second sub-group 113b may be divided into the first to $n^{th}$ regions A1 to An.

Meanwhile, X coordinate of the third sub-group 113c may be defined from 1 to i based on the distance from the second row decoder 143b, and Y coordinate of the third sub-group 113c may be defined from 1 to j based on the distance from the column decoder 153. Therefore, the third sub-group 113c may be divided into the first to $n^{th}$ regions A1 to An. Similarly, X coordinate of the fourth sub-group 113d may be defined from 1 to i based on the distance from the second row decoder 143b, and Y coordinate of the fourth sub-group 113d may be defined from 1 to j based on the distance from the column decoder 153. Therefore, the fourth sub-group 113d may be divided into the first to $n^{th}$ regions A1 to An.

Figure 16:
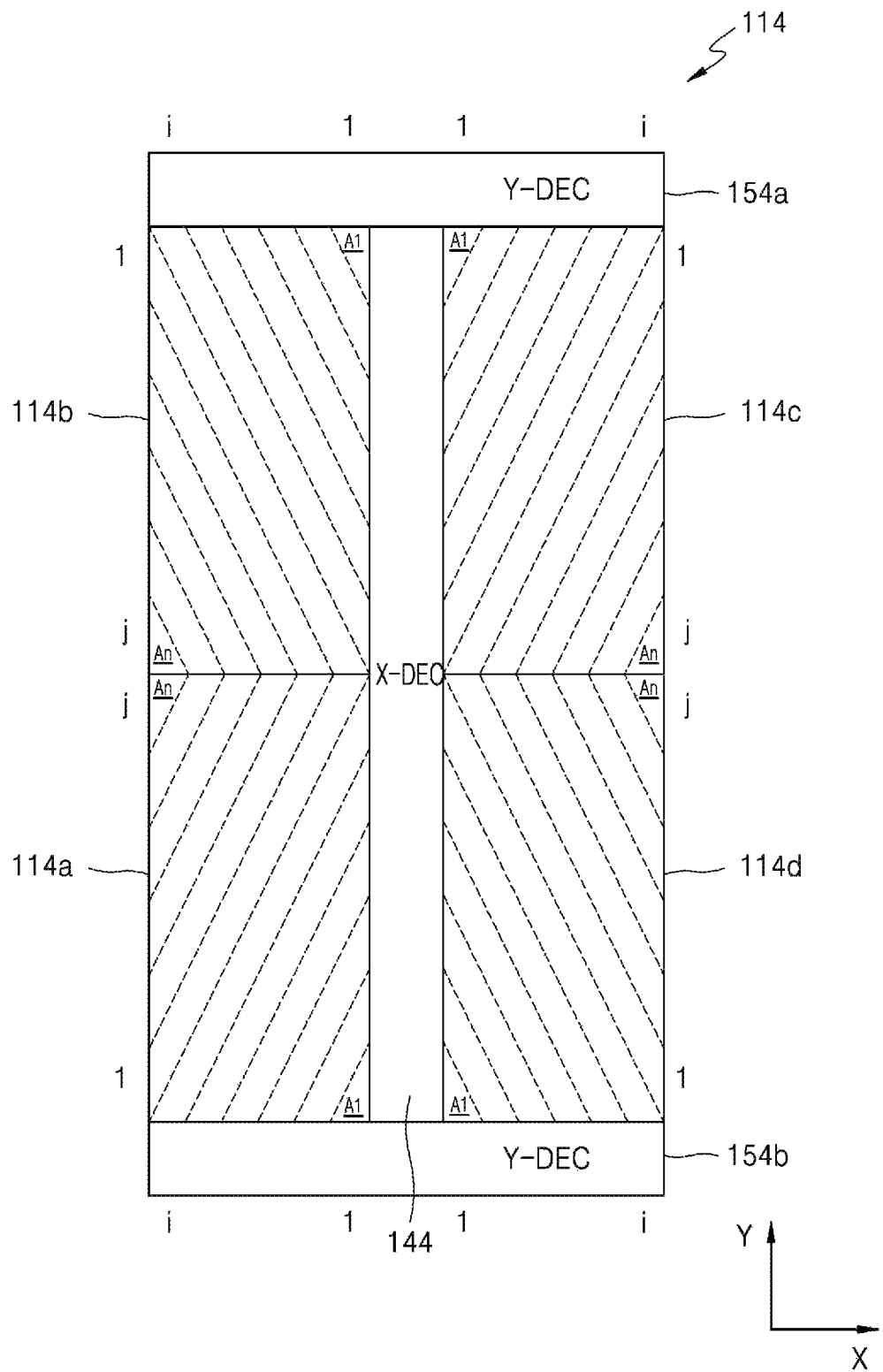

FIG. 16 illustrates a memory group 114 divided into a plurality of regions, according to an embodiment. Referring to FIG. 16, the memory group 114 may be divided into first to fourth sub-groups 114a to 114d. For example, the memory group 114 may correspond to a "tile", and the first to fourth sub-groups 114a to 114d may correspond to "sub-tiles". A row decoder 144 may be disposed in the middle of the memory group 114 in a second direction (Y-axis direction), and first and second column decoders 154a and 154b may be respectively disposed upper and lower ends of the memory group 114 in a first direction (X-axis direction).

The first and fourth sub-groups 114a and 114d may be connected to the row decoder 144 and the second column decoder 154b, and the second and third sub-groups 114b and 114c may be connected to the row decoder 144 and the first column decoder 154a. For example, the first to fourth sub-groups 114a to 114d may be divided into first to $n^{th}$ regions A1 to An according to the mapping table MTa of FIG. 2.

X coordinate of the first sub-group 114a may be defined from 1 to i based on the distance from the row decoder 144, and Y coordinate of the first sub-group 114a may be defined from 1 to j based on the distance from the second column decoder 154b. Therefore, the first sub-group 114a may be divided into the first to $n^{th}$ regions A1 to An. Similarly, X coordinate of the second sub-group 114b may be defined from 1 to i based on the distance from the row decoder 144, and Y coordinate of the second sub-group 114b may be defined from 1 to j based on the distance from the first column decoder 154a. Therefore, the second sub-group 114b may be divided into the first to $n^{th}$ regions A1 to An.

Meanwhile, X coordinate of the third sub-group 114c may be defined from 1 to i based on the distance from the row decoder 144, and Y coordinate of the third sub-group 114c may be defined from 1 to j based on the distance from the first column decoder 154a. Therefore, the third sub-group 114c may be divided into the first to $n^{th}$ regions A1 to An. Similarly, X coordinate of the fourth sub-group 114d may be defined from 1 to i based on the distance from the row decoder 144, and Y coordinate of the fourth sub-group 114d may be defined from 1 to j based on the distance from the second column decoder 154b. Therefore, the fourth sub-group 114d may be divided into the first to $n^{th}$ regions A1 to An.

Figure 17:
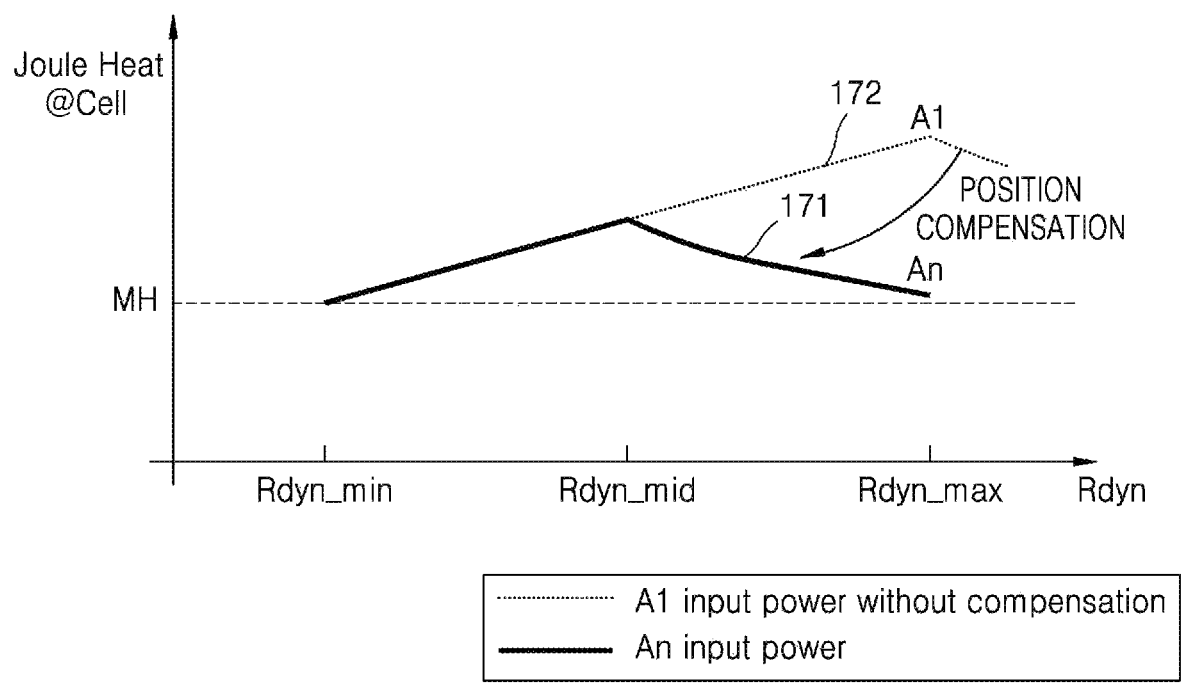
FIG. 17 illustrates input power based on a cell resistance distribution, according to an embodiment.

FIG. 17 illustrates input power based on a cell resistance distribution, according to an embodiment. Referring to FIGS. 5 and 17, a horizontal axis represents a cell resistance Rdyn, and a vertical axis represents input power per memory cell, that is, Joule heat. A first graph 171 represents input power of the memory cells included in the $n^{th}$ region An. Since the parasitic resistances of the memory cells included in the $n^{th}$ region An are large, the node voltage Vx may further decrease when the memory cell having a high cell resistance Rdyn is programmed. Therefore, the cell current Icell may further decrease. Therefore, the input power of the memory cell having a high cell resistance Rdyn may be similar to melting heat MH, and the memory cell may not be overprogrammed.

A second group 172 represents input power when position compensation is not performed on the memory cells included in the first region A1, according to comparative example. Since the parasitic resistances of the memory cells included in the first region A1 are small, the node voltage Vx may be relatively high. In particular, when the node voltage Vx is higher than or equal to the program voltage Vpgm, the cell current Icell may be equal to the program current Ipgm. Therefore, in spite of the application of the hybrid program method, when the cell resistance Rdyn is high among the memory cells included in the first region A1, the input power of the memory cell may increase as shown in the second group 172. Therefore, in spite of the application of the hybrid program method, when the parasitic resistance of the memory cell having a high cell resistance Rdyn is small, the memory cell may be overprogrammed, and the damage to the memory cell may be accelerated as the number of times of programs increases.

However, according to one or more embodiments, when the position compensation is performed on the memory cells included in the first region A1 with reference to the mapping table, the program voltage Vpgm of the memory cells included in the first region A1 and having a small parasitic resistance may increase. In this case, the program voltage Vpgm of the memory cells included in the first region A1 may be determined to be higher than the node voltage Vx. Therefore, the node voltage Vx may be lower than the program voltage Vpgm, and the additional current Iadd may flow. In this case, the cell current Icell may be smaller than the program current Ipgm, and the input power of the memory cell having a high cell resistance Rdyn may become similar to melting heat MH. Therefore, the input power of the memory cells having a high cell resistance Rdyn may also have a substantially flat shape as shown in the first graph 171.

Figure 18:
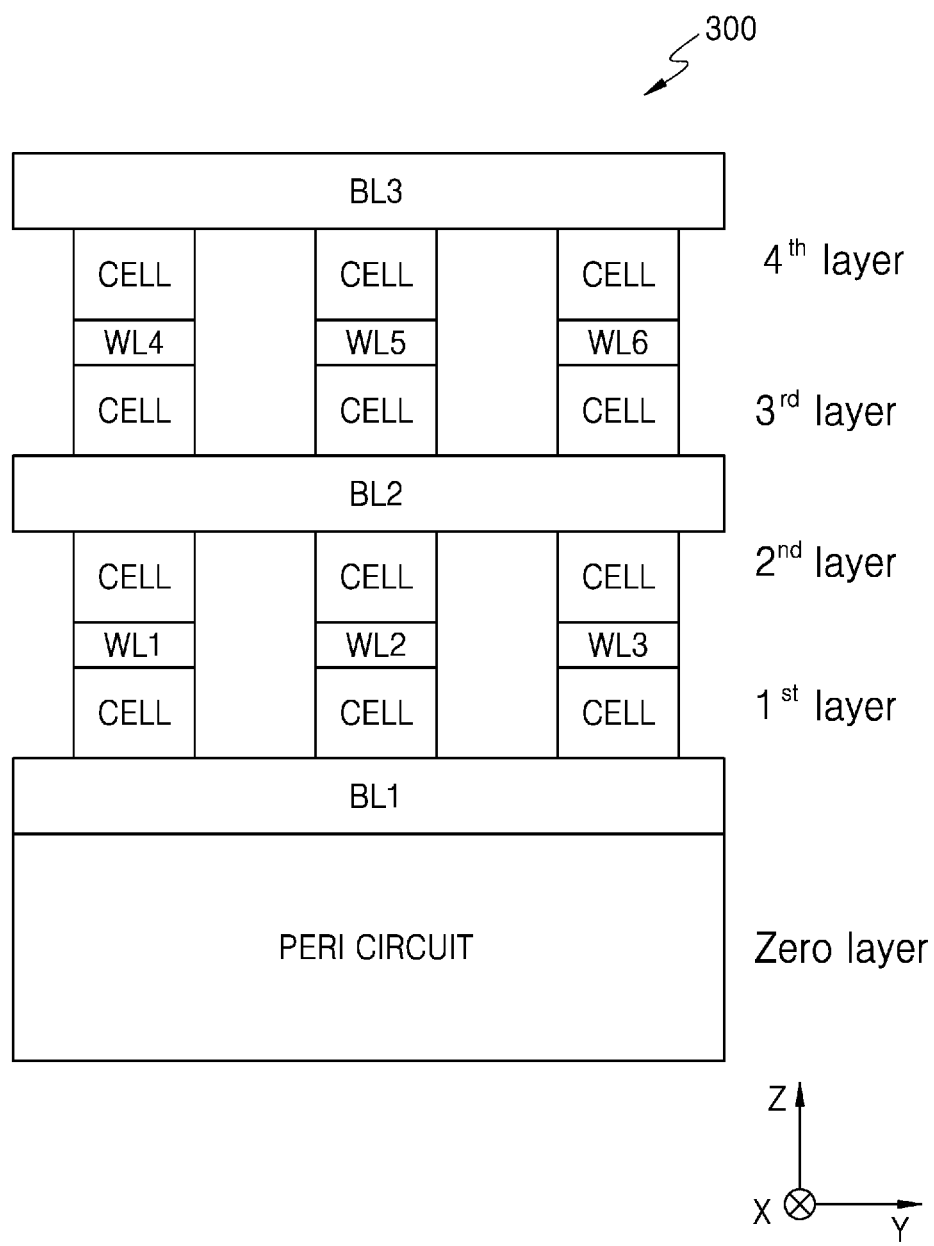
FIG. 18 illustrates a memory device having a multilayered structure, according to an embodiment.

FIG. 18 illustrates a memory device 300 having a multi-layered structure, according to an embodiment. Referring to FIG. 18, the memory device 300 may be a three-dimensional (3D) cross point memory device. First to third bit lines BL1 to BL3 may extend in a second direction (for example, Y direction) and may be stacked in a third direction (for example, Z direction). First to six word lines WL1 to WL6 may extend in a first direction (for example, X direction).

Memory cells of a first layer may be disposed in regions in which the first bit line BL1 and the first to third word lines WL1 to WL3 cross each other. Memory cells of a second layer may be disposed in regions in which the second bit line BL2 and the first to third word lines WL1 to WL3 cross each other. Memory cells of a third layer may be disposed in regions in which the second bit line BL2 and the fourth to sixth word lines WL4 to WL6 cross each other. Memory cells of a fourth layer may be disposed in regions in which the third bit line BL3 and the fourth to sixth word lines WL4 to WL6 cross each other. A peripheral circuit may be disposed in a zeroth layer. For example, the control circuit 120, the voltage generator 130, the row decoder 140, the column decoder 150 or the write circuit of FIG. 1 may be disposed in the zeroth layer.

In one embodiment, the memory group may be defined for each layer. For example, the memory cells of the first layer may be grouped into a plurality of memory groups, and each of the memory groups may be divided into a plurality of regions according to a mapping group. Program voltage control signals (for example, CTRL_VPGM in FIG. 1) may be determined according to the regions. Therefore, programs voltages (for example, Vpgm in FIG. 8) corresponding to the regions may be differently determined. However, embodiments of the inventive concept are not limited thereto. The memory groups may be defined with respect to the layers. For example, the memory cells of the first and second layers may be defined as one memory group.

Figure 19:
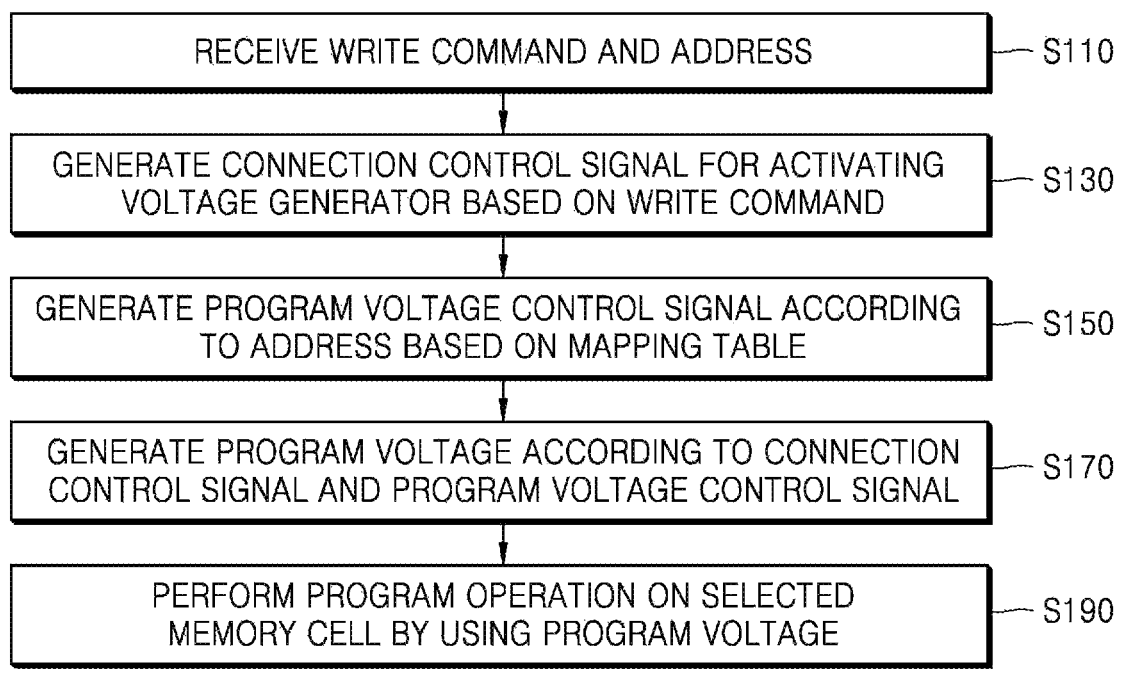
FIG. 19 is a flowchart of a program method of a memory device, according to an embodiment.

FIG. 19 is a flowchart of a program method of a memory device, according to an embodiment. Referring to FIG. 19, the program method of the memory device may include, for example, operations performed in time series by the memory device 100 of FIG. 3. Hereinafter, the program method of the memory device will be described with reference to FIGS. 3, 8, 13, and 19.

In operation S110, the memory device 100 receives the write command and the address ADDR from the memory controller 200. In addition, the memory device 100 may further receive the write data and various control signals CTRL from the memory controller 200.

In operation S130, the control circuit 120 generates the connection control signal CTRL_CON for activating the voltage generator 130 in response to the write command. In operation S150, the control circuit 120 generates the program voltage control signal CTRL_VPGM according to the address based on the mapping table. The control circuit 120 selects the region or parasitic resistance corresponding to the address based on the mapping table, and generates the program voltage control signal CTRL_VPGM corresponding to the selected region or parasitic resistance. In addition, the control circuit 120 may generate the row address X_ADDR and the column address Y_ADDR based on the address ADDR.

In operation S170, the voltage generator 130 generates the program voltage Vpgm according to the connection control signal CTRL_CON and the program voltage control signal CTRL_VPGM. The voltage generator 130 may be activated according to the connection control signal CTRL_CON. Specifically, since the voltage divider 131a is connected to the first and second voltage terminals Va and Vb, the current path of the voltage divider 131a may be turned on. Then, the voltage generator 130 may generate the program voltage Vpgm according to the program voltage control signal CTRL_VPGM, and provide the generated program voltage Vpgm to the node ND through the selected word line WL_sel. In this case, before the selected bit line BL_sel is electrically connected to the voltage terminal Vpp, the voltage generator 130 may provide the optimized program voltage Vpgm to the node ND.

In operation S190, the memory device 100 may perform the program operation on the selected memory cell MC_sel by using the generated program voltage Vpgm. In this case, the selected bit line BL_sel is electrically connected to the voltage terminal Vpp, and the program operation may be performed on the selected memory cell MC_sel according to the write data.

Figure 20:
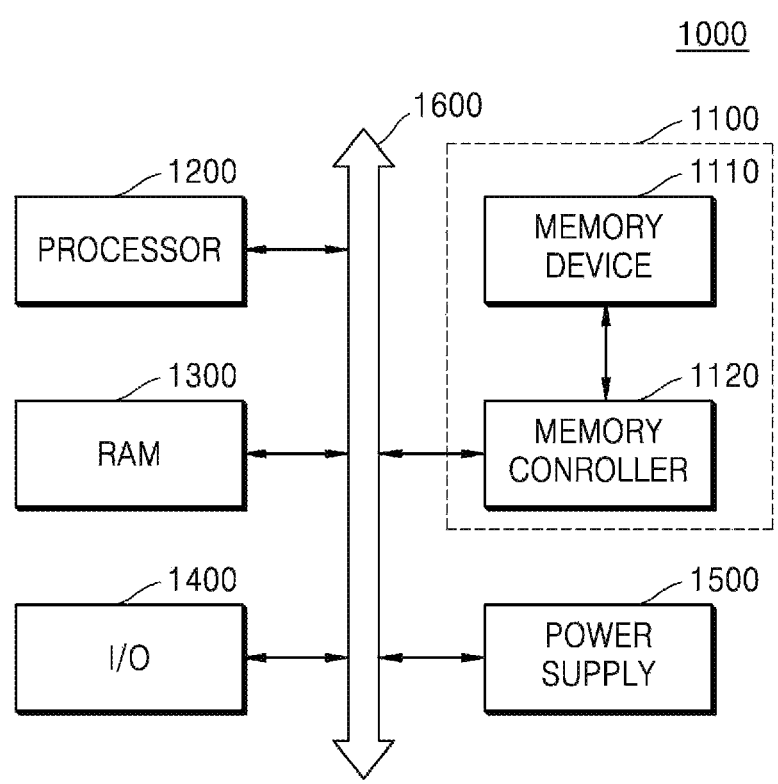
FIG. 20 illustrates a computing system according to an embodiment.

FIG. 20 illustrates a computing system 1000 according to an embodiment.

Referring to FIG. 20, the computing system 1000 may include a memory system 1100, a processor 1200, a RAM 1300, an input/output (I/O) device 1400, and a power supply 1500, wherein the memory system may include memory device 1110 and memory controller 1120. Meanwhile, although not illustrated in FIG. 20, the computing system 1000 may further include ports configured to communicate with a video card, a sound card, a memory card, a universal serial bus (USB) device, or other electronic devices. The computing system 1000 may be implemented by a personal computer, or may be implemented by a mobile electronic device such as a notebook computer, a mobile phone, a personal digital assistant (PDA), and a camera.

The processor 1200 may execute specific calculations or tasks. In one or more embodiments, the processor 1200 may be a microprocessor or a central processing unit (CPU). The processor 1200 may communicate with the RAM 1300, the I/O device 1400, and the memory system 1100 through a bus 1600 such as an address bus, a control bus, and a data bus. The memory system 1100 may be implemented by using the embodiments illustrated in FIGS. 1 to 19. In one or more embodiments, the processor 1200 may also be connected to an extension bus such as a peripheral component interconnect (PCI) bus.

The RAM 1300 may store data necessary for the operation of the computing system 1000. For example, the RAM 1300 may be implemented by a DRAM, a mobile DRAM, an SRAM, a PRAM, an FRAM, an RRAM, and/or an MRAM. The I/O device 1400 may include an input device such as a keyboard, a keypad, or a mouse, and an output device such as a printer or a display. The power supply 1500 may supply operating voltages necessary for the operation of the computing system 1000.

According to one or more embodiments, the resistive memory device may compensate for the change in the parasitic resistance value according to the position of the selected memory cell by adjusting the program voltage according to the position of the selected memory cell in the memory cell array. Specifically, the input power applied to the selected memory cell may be constantly maintained by adjusting the program voltage even when the position of the selected memory cell is changed. Therefore, the damage to the memory cell may be prevented to improve the endurance of the memory cell.

While the inventive concept has been particularly shown and described with reference to embodiments thereof, it will be understood that various changes in form and details may be made therein without departing from the spirit and scope of the following claims.

What is claimed is:

1. An integrated circuit memory device, comprising:
an array of resistive memory cells having at least one group of resistive memory cells therein; and
a programming circuit electrically coupled by a plurality of word lines and a plurality of bit lines to corresponding rows and columns of resistive memory cells in said array, said programming circuit comprising a control circuit and word line driver that are collectively configured to generate word line program voltages having magnitudes that vary as a function of the row and/or column addresses of the resistive memory cells in said array, during operations to program said array with write data using a mapping table that associates memory cell addresses to corresponding parasitic resistances that vary according to distances between respective resistive memory cells and a row decoder, which is electrically coupled by the plurality of word lines to said array of resistive memory cells;
wherein the at least one group of resistive memory cells is divided into n regions that are each associated with different parasitic resistances within the mapping table, where n is a positive integer greater than one.

2. The memory device of claim 1, wherein, according to the function, a magnitude of a word line program voltage associated with a first resistive memory cell having a first parasitic resistance associated therewith is less than a magnitude of a word line program voltage associated with a second resistive memory cell having a second parasitic resistance associated therewith, which is greater than the first parasitic resistance.

3. The memory device of claim 2, wherein said word line driver comprises a voltage generator configured to generate the word line program voltages in response to multi-bit program voltage control signals generated by the control circuit during the operations to program said array with write data.

4. The memory device of claim 3, wherein said word line driver is responsive to the word line program voltages generated by the voltage generator and address signals generated by the control circuit.

5. The memory device of claim 1, wherein said word line driver comprises a voltage generator configured to generate the word line program voltages in response to multi-bit program voltage control signals generated by the control circuit during the operations to program said array with write data.

6. The memory device of claim 5, wherein said word line driver is responsive to the word line program voltages generated by the voltage generator and address signals generated by the control circuit.

7. A resistive memory device comprising:
a memory cell array including a plurality of memory cells;
a control circuit configured to generate a program voltage control signal corresponding to an address of a selected memory cell among the plurality of memory cells, based on a mapping table defining a parasitic resistance according to an address of each of the plurality of memory cells;
a voltage generator configured to generate a program voltage having a first program voltage level among a plurality of program voltage levels, based on the program voltage control signal; and
a row decoder configured to provide the program voltage to a selected word line connected to the selected memory cell;
wherein the memory cell array includes a plurality of memory groups, and the mapping table is defined with respect to one of the plurality of memory groups and is commonly applied to the plurality of memory groups; and
wherein each of the memory groups is divided into n regions having different parasitic resistances by the mapping table, and n is an integer of 2 or more.

8. The resistive memory device of claim 7, wherein a parasitic resistance of the selected memory cell is changed according to a distance between the selected memory cell and the row decoder, and
as the parasitic resistance is smaller, the first program voltage level increases based on the program voltage signal.

9. The resistive memory device of claim 7, further comprising a write circuit configured to provide a program current to a selected bit line connected to the selected memory cell.

10. The resistive memory device of claim 9, wherein, when a cell resistance of the selected memory cell is smaller than or equal to a reference resistance, a cell current flowing through the selected memory cell is equal to the program current, and
when the cell resistance is larger than the reference resistance, the cell current is smaller than the program current.

11. The resistive memory device of claim 10, wherein the reference resistance corresponds to a median of a cell resistance distribution of the plurality of memory cells.

12. The resistive memory device of claim 9, further comprising a column decoder configured to electrically connect the write circuit to the selected bit line,
wherein the parasitic resistance of the selected memory cell is changed according to at least one of the distance between the selected memory cell and the row decoder, and a distance between the selected memory cell and the column decoder, and
as the parasitic resistance is smaller, the first program voltage level increases based on the program voltage signal.

13. The resistive memory device of claim 7, wherein the value of n is determined based on a cell resistance distribution of the plurality of memory cells and the parasitic resistances.

14. The resistive memory device of claim 7, wherein the program voltage control signal is an M-bit signal, and $2^M$ is greater than or equal to n.

15. A resistive memory device comprising:
a memory cell array including a plurality of memory cells;
a control circuit configured to generate a program voltage control signal corresponding to an address of a selected memory cell among the plurality of memory cells, based on a mapping table defining a parasitic resistance according to an address of each of the plurality of memory cells;
a voltage generator configured to generate a program voltage having a first program voltage level among a plurality of program voltage levels, based on the program voltage control signal; and a row decoder configured to provide the program voltage to a selected word line connected to the selected memory cell;

wherein the voltage generator includes:

a voltage divider including a plurality of resistors connected in series between a first voltage terminal and a second voltage terminal, and configured to output a plurality of voltages corresponding to the plurality of program voltage levels; and a switch group including a plurality of switches connected between the voltage divider and an output terminal and turned on and off according to the program voltage control signal, and configured to output the program voltage to the output terminal.

* * * * *